(12) United States Patent
Park et al.

(10) Patent No.: US 12,543,605 B2
(45) Date of Patent: Feb. 3, 2026

(54) SEMICONDUCTOR PACKAGE AND METHOD OF FABRICATING THE SAME

(71) Applicant: Samsung Electronics Co., Ltd., Suwon-si (KR)

(72) Inventors: Sungwoo Park, Suwon-si (KR); Yongjae Kim, Suwon-si (KR); Heonwoo Kim, Suwon-si (KR); Seung-Kwan Ryu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 383 days.

(21) Appl. No.: 18/227,646

(22) Filed: Jul. 28, 2023

(65) Prior Publication Data
US 2024/0213199 A1 Jun. 27, 2024

(30) Foreign Application Priority Data
Dec. 23, 2022 (KR) .................. 10-2022-0183175

(51) Int. Cl.
*H01L 23/48* (2006.01)
*H01L 23/00* (2006.01)
(Continued)

(52) U.S. Cl.
CPC ........ *H01L 24/13* (2013.01); *H01L 23/49816* (2013.01); *H01L 24/16* (2013.01);
(Continued)

(58) Field of Classification Search
CPC ... H01L 24/13; H01L 23/49816; H01L 24/16; H01L 24/17; H01L 25/0657; H01L 2224/13017; H01L 2224/1703; H01L 2225/06517; H01L 2225/06544; H01L 2225/06513; H01L 2225/06541; H01L 2225/1058; H01L 24/81; H01L 25/105; H01L 25/50; H01L 23/49811; H01L 21/4853; H01L 23/49838; H01L 23/49894;
(Continued)

(56) References Cited

U.S. PATENT DOCUMENTS 5,641,946 A    6/1997   Shim
6,443,351 B1   9/2002   Huang et al.
(Continued)

FOREIGN PATENT DOCUMENTS

JP           6287103 B2     3/2018

*Primary Examiner* — Theresa T Doan
(74) *Attorney, Agent, or Firm* — Sughrue Mion, PLLC

(57) ABSTRACT

The present disclosure provides semiconductor packages and methods of fabricating the same. In some embodiments, a semiconductor package includes a substrate including first and second regions, a first pad on the first region, a second pad on the second region, a first dielectric layer on the first region and including a first opening exposing the first pad, a second dielectric layer on the second region and including a second opening exposing the second pad, a first bump structure on the first pad and in the first opening, and a second bump structure on the second pad and in the second opening. A thickness of the first dielectric layer is greater than a thickness of the second dielectric layer. A distance between the substrate and an uppermost end of the first bump structure is longer than a distance between the substrate and an uppermost end of the second bump structure.

20 Claims, 16 Drawing Sheets

(51) Int. Cl.
*H01L 23/498* (2006.01)
*H01L 23/52* (2006.01)
*H01L 25/065* (2023.01)

(52) U.S. Cl.
CPC .......... *H01L 24/17* (2013.01); *H01L 25/0657* (2013.01); *H01L 2224/13017* (2013.01); *H01L 2224/16225* (2013.01); *H01L 2224/1703* (2013.01); *H01L 2225/06517* (2013.01); *H01L 2225/06544* (2013.01); *H01L 2924/37001* (2013.01)

(58) Field of Classification Search
CPC ................ H01L 23/13; H01L 23/3128; H01L 23/49827; H01L 24/06; H01L 24/09; H01L 2224/0401
USPC ....................................................... 257/737
See application file for complete search history.

(56) References Cited

U.S. PATENT DOCUMENTS

| | | |
|---|---|---|
| 6,940,178 B2 | 9/2005 | Kweon et al. |
| 9,059,106 B2 | 6/2015 | Daubenspeck et al. |
| 9,230,876 B2 | 1/2016 | Lee et al. |
| 10,257,942 B1 | 4/2019 | Yoshida et al. |
| 10,332,757 B2 * | 6/2019 | Shih .................... H01L 25/0657 |
| 10,818,627 B2 | 10/2020 | Liu et al. |
| 10,833,034 B2 | 11/2020 | Chang |
| 12,132,022 B2 * | 10/2024 | Fan .................... H01L 23/3171 |
| 2022/0013492 A1 | 1/2022 | Huang et al. |

* cited by examiner

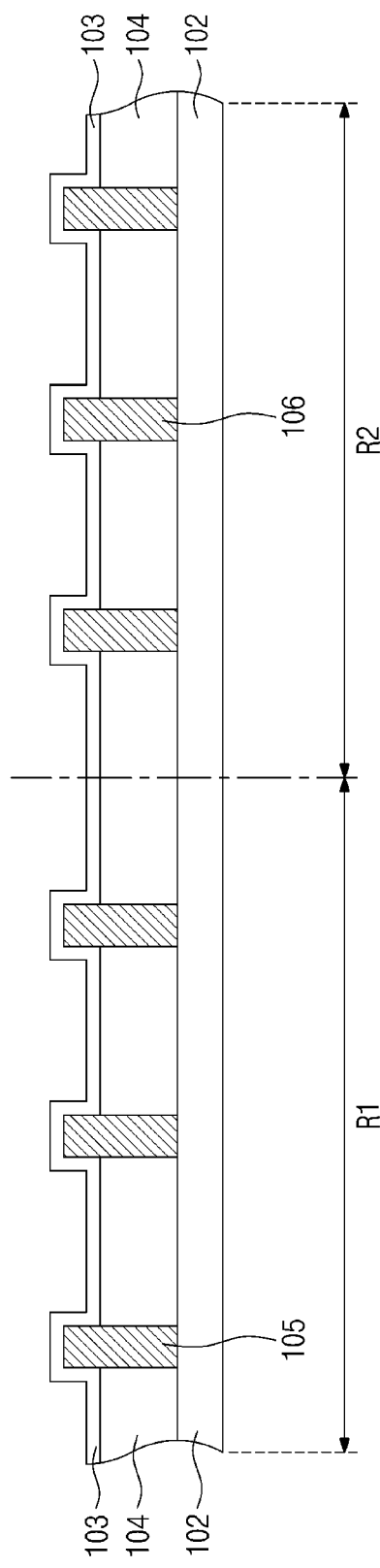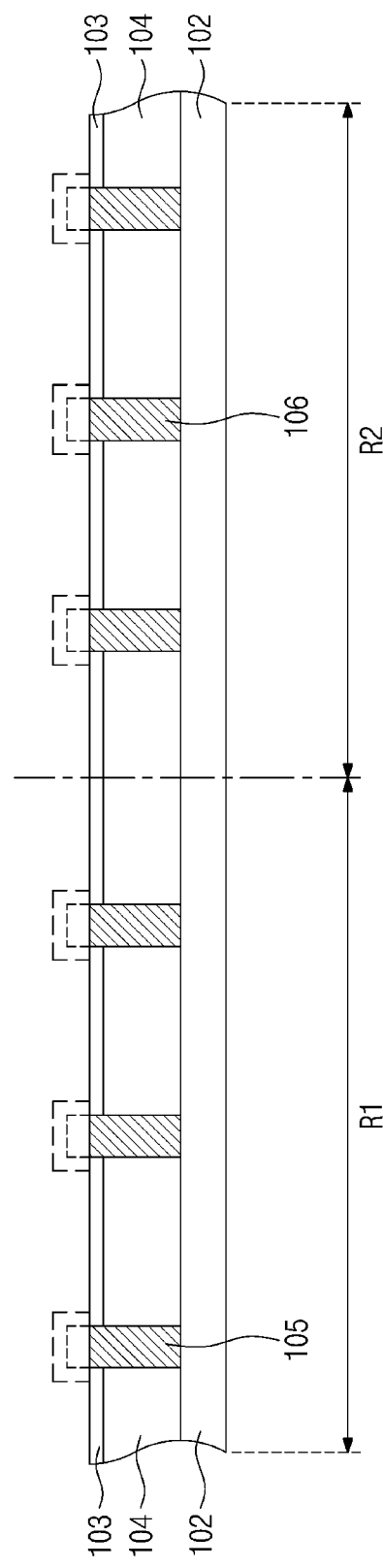

SEMICONDUCTOR PACKAGE AND METHOD OF FABRICATING THE SAME

CROSS-REFERENCE TO RELATED APPLICATIONS

This application claims benefit of priority under 35 U.S.C § 119 to Korean Patent Application No. 10-2022-0183175, filed on Dec. 23, 2022, in the Korean Intellectual Property Office, the disclosure of which is incorporated by reference herein in its entirety.

BACKGROUND

1. Field

The present disclosure relates generally to a semiconductor packages, and more particularly, to a semiconductor package having a metal bump and a method of fabricating the same.

2. Description of Related Art

Related trends in electronics industries may include, but be limited to, fabricating lightweight, compact, high speed, multi-functionality, and high performance products at reasonable prices. To that end, a multi-chip stacked package technique and/or a system-in-package technique may be used to potentially meet these trends. For example, in a multi-chip stacked package and/or a system-in-package, a semiconductor package may perform functions of several unit semiconductor devices. Although the multi-chip stacked package and/or the system-in-package may be thicker than a typical single chip package, the multi-chip stacked package and/or the system-in-package may have a planar size similar to that of a single chip package and thus may be primarily used for high-end, compact, and portable products such as, but not limited to, mobile phones, laptop computers, memory cards, and portable camcorders.

A related semiconductor device may use a metal bump as an electrical connection terminal and/or a dummy terminal. However, shape abnormality of the metal bump may lead to a yield drop and/or a process failure, and may induce the semiconductor device to have inferior electrical characteristics. Thus, there exists a need for the metal bump be formed without shape abnormality in manufacturing the semiconductor device.

SUMMARY

Aspects of the present disclosure provide a semiconductor package having an improved driving stability, when compared to related semiconductor packages, and a method of fabricating the same.

Aspects of the present disclosure provide a method of fabricating a semiconductor package whose process is simplified and has fewer occurrences of defects, when compared to related semiconductor packages, and a semiconductor package fabricated by the same.

According to an aspect of the present disclosure, a semiconductor package is provided. The semiconductor package includes a substrate including a first region and a second region spaced apart from the first region, a first pad on the substrate of the first region, a second pad on the substrate of the second region, a first dielectric layer disposed on the substrate on the first region and including a first opening that exposes the first pad, a second dielectric layer disposed on the substrate on the second region and including a second opening that exposes the second pad, a first bump structure disposed on the first pad and in the first opening of the first dielectric layer, and a second bump structure disposed on the second pad and in the second opening of the second dielectric layer. A first thickness of the first dielectric layer is greater than a second thickness of the second dielectric layer. A first distance between the substrate and an uppermost end of the first bump structure is longer than a second distance between the substrate and an uppermost end of the second bump structure.

According to an aspect of the present disclosure, a semiconductor package is provided. The semiconductor package includes a substrate including a central region and a peripheral region that surrounds the central region, a first pad on the central region on a bottom surface of the substrate, a second pad on the peripheral region on the bottom surface of the substrate, a dielectric layer on the bottom surface of the substrate and disposed on the first pad and the second pad. The dielectric layer includes a first opening that exposes at least a portion of a bottom surface of the first pad and a second opening that exposes at least a portion of a bottom surface of the second pad. The semiconductor package further includes a first bump structure on the dielectric layer on the central region and coupled through the first opening to the first pad, a second bump structure on the dielectric layer on the peripheral region and coupled through the second opening to the second pad, a semiconductor chip on a top surface of the substrate, and a molding layer covering the top surface of the substrate and burying the semiconductor chip. The substrate has a concave shape. A first recess level of the central region is deeper than a second recess level of the peripheral region. A first thickness of the dielectric layer on the first pad is greater than a second thickness of the dielectric layer on the second pad. A first width of the first opening is less than a second width of the second opening.

According to an aspect of the present disclosure, a semiconductor package is provided. The semiconductor package includes a substrate including a first region and a second region spaced apart from the first region, a first pad on the substrate of the first region, a second pad on the substrate of the second region, a dielectric layer on the substrate and covering at least a first portion of the first pad and at least a second portion of the second pad. The dielectric layer including a first opening that exposes at least a third portion of a top surface of the first pad and a second opening that exposes at least a fourth portion of a top surface of the second pad. The semiconductor package further includes a first bump structure on the dielectric layer and coupled through the first opening to the first pad, and a second bump structure on the dielectric layer and coupled through the second opening to the second pad. A difference between a first thickness of the dielectric layer on the first region and second thickness of the dielectric layer on the second region is about 20% to about 80% of the first thickness.

According to an aspect of the present disclosure, a method of fabricating a semiconductor package is provided. The method includes providing a substrate including a first region and a second region spaced apart from the first region, forming on the substrate a first pad on the first region and a second pad on the second region, forming on the substrate a photo-imageable layer that covers the first pad and the second pad, performing an exposure process on the photo-imageable layer, using a photomask, to form a dielectric layer including a first opening that exposes the first pad and a second opening that exposes the second pad, and forming on the dielectric layer a first bump structure coupled through the first opening to the first pad and a second bump structure coupled through the second opening to the second pad. The performing of the exposure process causes a first thickness of the dielectric layer on the first region to differ from a second thickness of the dielectric layer on the second region.

Additional aspects may be set forth in part in the description which follows and, in part, may be apparent from the description, and/or may be learned by practice of the presented embodiments.

BRIEF DESCRIPTION OF THE DRAWINGS

The above and other aspects, features, and advantages of certain embodiments of the present disclosure may be more apparent from the following description taken in conjunction with the accompanying drawings, in which:

FIGS. 9 to 19 illustrate cross-sectional views showing a method of fabricating a semiconductor package, according to some embodiments of the present disclosure.

DETAILED DESCRIPTION

Figure 1:
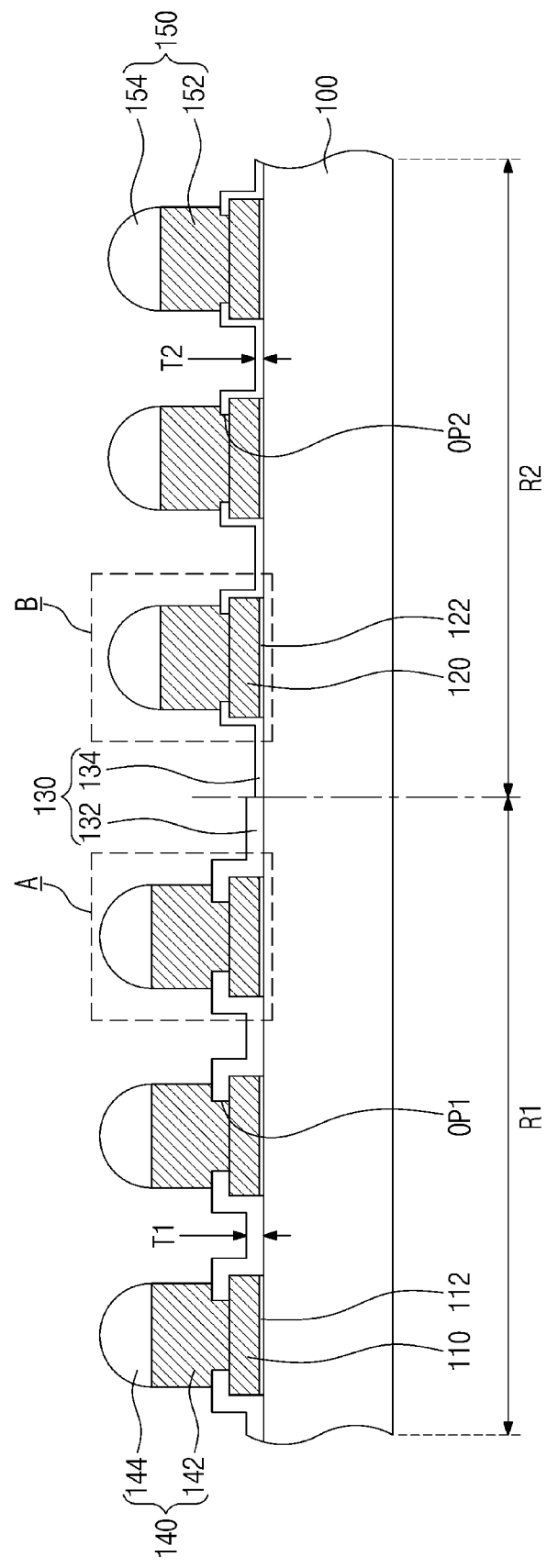
FIG. 1 illustrates a cross-sectional view showing a semiconductor package, according to some embodiments of the present disclosure.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", etc. may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

As used herein, each of the terms "AlGaAs", "GaAs", "InGaAs", "SiCN", "SiGe", "SiN", "SiO", "SiON", and the like may refer to a material made of elements included in each of the terms and is not a chemical formula representing a stoichiometric relationship.

Hereinafter, various embodiments of the present disclosure are described with reference to the accompanying drawings.

Figure 2:
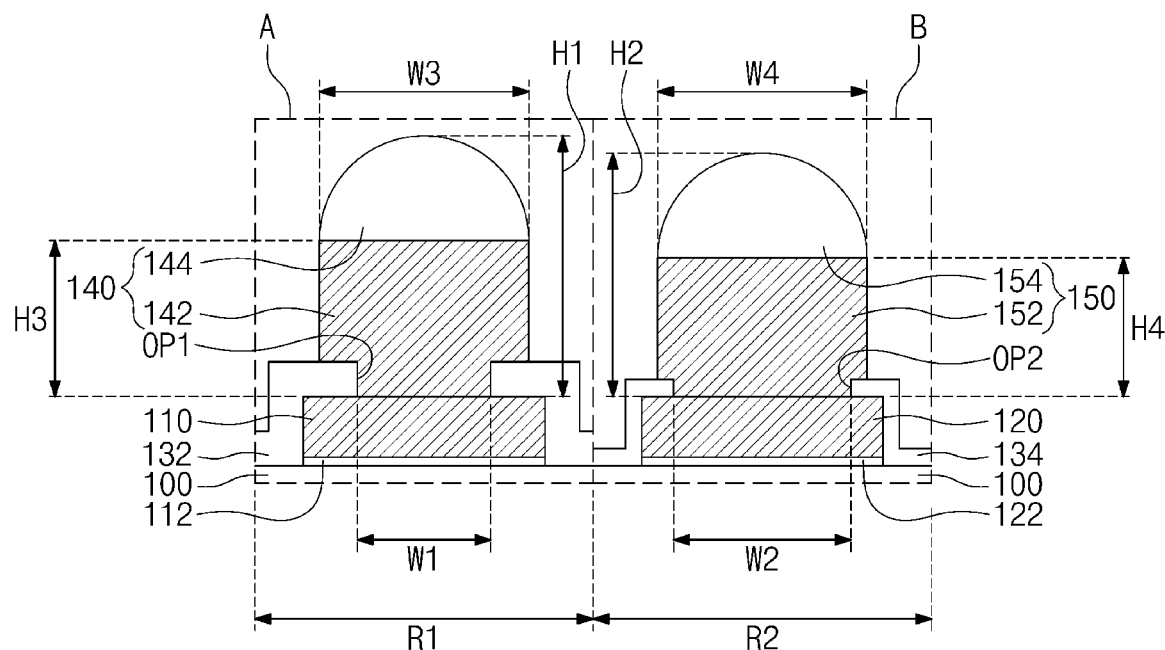
FIG. 2 illustrates an enlarged view showing sections A and B of FIG. 1, according to some embodiments of the present disclosure.
Figure 3:
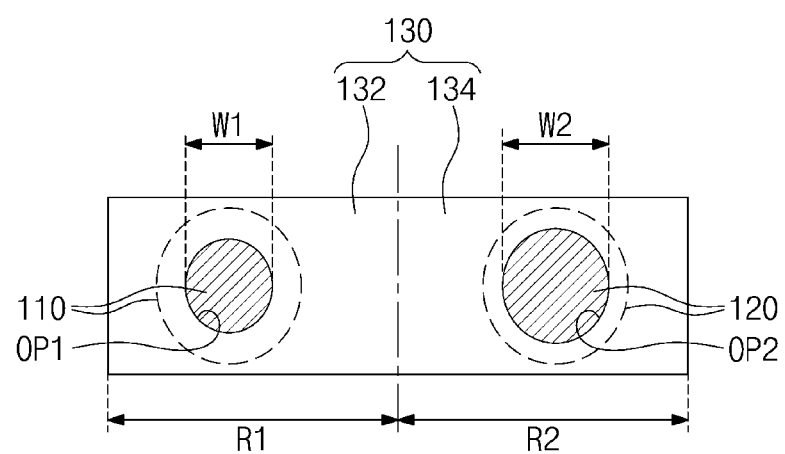
FIG. 3 illustrates an enlarged plan view partially showing a semiconductor package, according to some embodiments of the present disclosure.

FIG. 1 illustrates a cross-sectional view showing a semiconductor package, according to some embodiments of the present disclosure. FIG. 2 illustrates an enlarged view showing sections A and B of FIG. 1, according to some embodiments of the present disclosure. FIG. 3 illustrates an enlarged plan view partially showing a semiconductor package, according to some embodiments of the present disclosure.

Referring to FIGS. 1 to 3, a substrate 100 may be provided. The substrate 100 may be and/or include a package substrate to mount a semiconductor package on an external apparatus, a motherboard, or another substrate. Alternatively or additionally, the substrate 100 may be and/or include an interposer configured to redistribute semiconductor chips of a semiconductor package and/or to connect semiconductor chips to a package substrate of a semiconductor package. For example, the substrate 100 may be a printed circuit board (PCB) having a signal pattern and/or a redistribution substrate having a plurality of wiring layers. In another example, the substrate 100 may be and/or include a semiconductor substrate. That is, the substrate 100 may be and/or include a semiconductor substrate such as, but not limited to, a semiconductor wafer.

In some embodiments, the substrate 100 may be and/or include a bulk silicon substrate, a silicon-on-insulator (SOI) substrate, a germanium (Ge) substrate, a germanium-on-insulator (GOI) substrate, a silicon-germanium (SiGe) substrate, or an epitaxial film substrate obtained by performing selective epitaxial growth (SEG). In optional or additional embodiments, the substrate 100 may include, but not be limited to, silicon (Si), germanium (Ge), silicon germanium (SiGe), gallium arsenic (GaAs), indium gallium arsenic (InGaAs), aluminum gallium arsenic (AlGaAs), and a mixture thereof. When the substrate 100 includes a semiconductor substrate, the substrate 100 may include an integrated circuit therein. The substrate 100 may be a semiconductor chip including an electric device such as a transistor. For example, the substrate 100 may be a wafer-level die formed of a semiconductor such as silicon (Si).

The substrate 100 may have a first region R1 and a second region R2. The first region R1 and the second region R2 may be distinguished areas that do not overlap each other. FIG. 1 depicts that the first region R1 and the second region R2 are in contact with each other, but the present disclosure is not limited thereto. For example, the first region R1 and the second region R2 may be spaced apart from each other. As shown in FIG. 1, the first region R1 and the second region R2 may be areas defined based on a shape of the substrate 100. The first region R1 and the second region R2 may be further described with reference to FIGS. 4 to 6.

The substrate 100 may have first substrate pads (or first pads) 110 and second substrate pads (or second pads) 120 that may be provided on a top surface of the substrate 100. The first substrate pads 110 may be disposed on the first region R1 of the substrate 100. The second substrate pads 120 may be disposed on the second region R2 of the substrate 100. The first substrate pads 110 may be disposed spaced apart from each other, and the second substrate pads 120 may be disposed spaced apart from each other. The first substrate pads 110 may be spaced apart from the second substrate pads 120. The heights of first substrate pads 110 may be substantially similar and/or the same as the heights of the second substrate pads 120. For example, a distance between the top surface of the substrate 100 and top surfaces of the first substrate pads 110 may be substantially similar and/or the same as a distance between the top surface of the substrate 100 and top surfaces of the second substrate pads 120. Alternatively or additionally, the width of the first substrate pads 110 may be substantially similar and/or the same as the width of the second substrate pads 120. The present disclosure, however, is not limited thereto, and the widths of the first substrate pads 110 may be different from those of the second substrate pads 120.

In some embodiments, the first substrate pads 110 and the second substrate pads 120 may be electrically connected to internal wiring lines and/or a circuit in the substrate 100. For example, the first and second substrate pads 110 and 120 may each have a circular planar shape as shown in FIG. 3. Alternatively or additionally, the first and second substrate pads 110 and 120 may each have a polygonal planar shape, such as a rectangular planar shape, and/or a linear planar shape. The first and second substrate pads 110 and 120 may include metal, such as, but not limited to, copper (Cu).

In some embodiments, seed layers may be provided between the first substrate pads 110 and the substrate 100 and between the second substrate pads 120 and the substrate 100. For example, first seed layers 112 may be provided between the substrate 100 and the first substrate pads 110, and second seed layers 122 may be provided between the substrate 100 and the second substrate pads 120. Each of the first seed layers 112 may be provided on a bottom surface of one of the first substrate pads 110. Each of the second seed layers 122 may be provided on a bottom surface of one of the second substrate pads 120. For ease of illustration, FIG. 1 depicts that the first seed layers 112 cover only the bottom surfaces of the first substrate pads 110 and the second seed layers 122 cover only the bottom surfaces of the second substrate pads 120. However, the present disclosure is not limited thereto. For example, the first seed layers 112 may extend from the bottom surfaces of the first substrate pads 110 onto lateral surfaces of the first substrate pads 110. Alternatively or additionally, the second seed layers 122 may extend from the bottom surfaces of the second substrate pads 120 onto lateral surfaces of the second substrate pads 120. The first and second seed layers 112 and 122 may include metal, such as, but not limited to, gold (Au).

A protection layer 130 may be provided on the substrate 100, according to some embodiments. The protection layer 130 may cover (e.g., be disposed on) at least a portion of the top surface of the substrate 100. Alternatively or additionally, the protection layer 130 may cover (e.g., be disposed on) at least a portion of the first substrate pads 110 on the first region R1 and/or may also cover (e.g., be disposed on) at least a portion of the second substrate pads 120 on the second region R2. In some embodiments, the protection layer 130 may conformally cover the top surface of the substrate 100, the first substrate pads 110, and the second substrate pads 120. The protection layer 130 may include a photo-imageable material. For example, the protection layer 130 may include a photo-imageable dielectric (PID). That is, the photo-imageable dielectric may include, but not be limited to, at least one of photosensitive polyimide (PI), polybenzoxazole (PBO), phenolic polymers, and benzocyclobutene polymers.

In some embodiments, the protection layer 130 may have different thicknesses on the first region R1 and the second region R2. For convenience of description, the protection layer 130 may have a portion, which may be referred to as a first dielectric layer 132, positioned on the first region R1, and may also have another portion, which may be referred to as a second dielectric layer 134, positioned on the second region R2.

On the first region R1, the first dielectric layer 132 may conformally cover the first substrate pads 110 and the top surface of the substrate 100. On the second region R2, the second dielectric layer 134 may conformally cover the second substrate pads 120 and the top surface of the substrate 100. A first thickness T1 of the first dielectric layer 132 may be greater than a second thickness T2 of the second dielectric layer 134. For example, a difference between the first thickness T1 and the second thickness T2 may be about 20% to about 80% of the first thickness T1. The second thickness T2 may be about 0.2 times to about 0.8 times the first thickness T1. A difference in thickness between the first dielectric layer 132 and the second dielectric layer 134 may allow the protection layer 130 to have a step difference on a boundary between the first region R1 and the second region R2. The present disclosure, however, is not limited thereto, and a thickness of the protection layer 130 may be continuously changed on the boundary between the first region R1 and the second region R2. For example, a top surface of the protection layer 130 may be inclined on the boundary between the first region R1 and the second region R2. When the first region R1 and the second region R2 are spaced apart from each other, the step difference of the protection layer 130 may be present on another region positioned between the first region R1 and the second region R2 and/or the top surface of the protection layer 130 may be inclined on the another region positioned between the first region R1 and the second region R2.

Continuing to refer to FIG. 1, the protection layer 130 may have openings that vertically penetrate the protection layer 130. For example, the protection layer 130 may have first openings OP1 positioned on the first region R1 and second openings OP2 positioned on the second region R2. On the first region R1, the first openings OP1 may be positioned on the first substrate pads 110. The first openings OP1 may be correspondingly positioned on the first substrate pads 110, and may partially expose the top surfaces of the first substrate pads 110. For example, planar shapes and areas of the first openings OP1 may be smaller than those of the first substrate pads 110. When viewed in a plan view, as shown in FIG. 3, each of the first openings OP1 may be positioned within one of the first substrate pads 110. For example, the first openings OP1 may correspondingly expose central portions of the first substrate pads 110, and the first dielectric layer 132 may cover an edge of each of the first substrate pads 110.

On the second region R2, the second openings OP2 may be positioned on the second substrate pads 120. The second openings OP2 may be correspondingly positioned on the second substrate pads 120, and may partially expose the top surfaces of the second substrate pads 120. For example, planar shapes and areas of the second openings OP2 may be smaller than those of the second substrate pads 120. When viewed in a plan view, as shown in FIG. 3, each of the second openings OP2 may be positioned within one of the second substrate pads 120. For example, the second openings OP2 may correspondingly expose central portions of the second substrate pads 120, and the second dielectric layer 134 may cover an edge of each of the second substrate pads 120.

The first and second openings OP1 and OP2 may each have a circular planar shape as shown in FIG. 3. Alternatively or additionally, the first and second openings OP1 and OP2 may each have a polygonal planar shape, such as, but not limited to, a rectangular or octagonal planar shape. A first width W1 of the first opening OP1 may be less than a second width W2 of the second opening OP2. For example, the second width W2 may be about 1.1 times to about 1.5 times the first width W1. A thickness of the first dielectric layer 132, a thickness of the second dielectric layer 134, widths of the first opening OP1, and widths of the second openings OP2 may depend on a height difference between bump structures 140 and 150, as described with reference to FIGS. 9 to 19.

In some embodiments, bump structures may be provided on the protection layer 130. For example, on the first region R1, first bump structures 140 may be disposed on the protection layer 130, and on the second region R2, second bump structures 150 may be disposed on the protection layer 130.

Each of the first bump structures 140 may be positioned on one of the first substrate pads 110. The first bump structures 140 may penetrate the first dielectric layer 132 to come into connection with the first substrate pads 110. For example, the first bump structures 140 may be coupled to the top surfaces of the first substrate pads 110 exposed by the first openings OP1. A third width W3 of the first bump structure 140 may be greater than the first width W1 of the first opening OP1. That is, when viewed in a plan view, the first openings OP1 may be positioned within the first bump structures 140. The first bump structures 140 may protrude onto the first dielectric layer 132. Consequently, the first bump structures 140 may completely fill the first openings OP1, and/or portions of the first bump structures 140 may extend onto the first dielectric layer 132. For example, the first bump structures 140 may completely cover the first openings OP1, and the first bump structures 140 may prevent the first openings OP1 from being visible from the outside. Each of the first bump structures 140 may have a first conductive post 142 and a first solder bump 144 provided on the first conductive post 142.

In some embodiments, the first conductive post 142 may have a pillar shape. In such embodiments, the first conductive post 142 may have a constant width. Alternatively or additionally, the width of the first conductive post 142 may correspond to the third width W3 of the first bump structure 140. In optional or additional embodiments, on the first substrate pad 110, the first conductive post 142 may contact the first substrate pad 110, fill the first opening OP1, and protrude onto the first dielectric layer 132. For example, as shown in FIG. 2, on the first substrate pad 110, the first dielectric layer 132 may have a shape that is inserted into a lower portion of the first conductive post 142. The first conductive post 142 may include a metallic material, such as, but not limited to, copper (Cu).

The first solder bump 144 may be disposed on a top surface of the first conductive post 142. The first solder bump 144 may have a hemispheric shape that covers the top surface of the first conductive post 142. The present disclosure, however, is not limited thereto. That is, the first solder bump 144 may have other shapes without departing from the scope of the disclosure. A maximum width of the first solder bump 144 may be substantially similar and/or the same as the width of the first conductive post 142. The first solder bump 144 may include a solder material or alloy including, but not limited to, tin (Sn).

Each of the second bump structures 150 may be positioned on one of the second substrate pads 120. The second bump structures 150 may penetrate the second dielectric layer 134 to come into connection with the second substrate pads 120. For example, the second bump structures 150 may be coupled to the top surfaces of the second substrate pads 120 exposed by the second openings OP2. A fourth width W4 of the second bump structure 150 may be substantially similar and/or the same as the third width W3 of the first bump structure 140. Alternatively or additionally, the fourth width W4 of the second bump structure 150 may be greater than the second width W2 of the second opening OP2. When viewed in a plan view, the second openings OP2 may be positioned within the second bump structures 150. The second bump structures 150 may protrude onto the second dielectric layer 134. Consequently, the second bump structures 150 may completely fill the second openings OP2, and portions of the second bump structures 150 may extend onto the second dielectric layer 134. For example, the second bump structures 150 may completely cover the second openings OP2, and/or the second bump structures 150 may prevent the second openings OP2 from being visible from the outside. Each of the second bump structures 150 may have a second conductive post 152 and a second solder bump 154 provided on the second conductive post 152.

In some embodiments, the second conductive post 152 may have a pillar shape. In such embodiments, the second conductive post 152 may have a constant width. Alternatively or additionally, the width of the second conductive post 152 may correspond to the fourth width W4 of the second bump structure 150. In optional or additional embodiments, on the second substrate pad 120, the second conductive post 152 may contact the second substrate pad 120, fill the second opening OP2, and protrude onto the second dielectric layer 134. For example, as shown in FIG. 2, on the second substrate pad 120, the second dielectric layer 134 may have a shape that is inserted into a lower portion of the second conductive post 152. The second conductive post 152 may include a metallic material, such as, but not limited to, copper (Cu).

The second solder bump 154 may be disposed on a top surface of the second conductive post 152. The second solder bump 154 may have a hemispheric shape that may cover the top surface of the second conductive post 152. The present disclosure, however, is not limited thereto. A maximum width of the second solder bump 154 may be substantially similar and/or the same as the width of the second conductive post 152. The second solder bump 154 may include a solder material or alloy including, but not limited to, tin (Sn).

The first bump structure 140 and the second bump structure 150 may have heights different from each other. As shown in FIG. 2, a first distance between the top surface of the substrate 100 and an uppermost end of the first bump structure 140 may be greater than a second distance between the top surface of the substrate 100 and an uppermost end of the second bump structure 150. A difference between the first distance and the second distance may be about 2% to about 10% of the first distance. A thickness of the first substrate pad 110 may be substantially similar and/or the same as a thickness of the second substrate pad 120. Therefore, a first height H1 of the first bump structure 140 may be greater than a second height H2 of the second bump structure 150. A third height H3 of the first conductive post 142 included in the first bump structure 140 may be greater than a fourth height H4 of the second conductive post 152 included in the second bump structure 150. For example, a volume of the first conductive post 142 may be substantially similar and/or the same as a volume of the second conductive post 152. In such an example, the width of the first conductive post 142 included in the first bump structure 140 may be substantially similar and/or the same as a width of the second conductive post 152 included in the second bump structure 150. Alternatively or additionally, a thickness and an insertion depth of the first dielectric layer 132 inserted into the lower portion of the first conductive post 142 may be greater than those of the second dielectric layer 134 inserted into the lower portion of the second conductive post 152. Thus, the third height H3 of the first conductive post 142 included in the first bump structure 140 may be greater than the fourth height H4 of the second conductive post 152 included in the second bump structure 150. A width and a height of the first solder bump 144 positioned on the first conductive post 142 may be substantially similar and/or the same as those of the second solder bump 154 positioned on the second conductive post 152.

According to some embodiments of the present disclosure, the bump structures 140 and 150 may have their heights changed based on position of the substrate 100. Consequently, even in the presence of warpage of the substrate 100 and/or deviations in the height of pads on another substrate and/or device on which the substrate 100 is mounted, the bump structures 140 and 150 of the substrate 100 may be easily coupled to the pads. For example, although an irregular distance may be present between the pads and the substrate 100, the bump structures 140 and 150 may have their different heights based on the distance between the pads and the substrate 100. As a result, an occurrence of a contact failure where none of the bump structures 140 and 150 are coupled to the pads may be potentially reduced or eliminated. Thus, the present disclosure may provide a semiconductor package with good electrical connection properties and improved driving stability, when compared to related semiconductor packages.

Alternatively or additionally, the bump structures 140 and 150 may have substantially similar widths while having different heights. For example, the third width W3 of the first bump structures 140 may not be greater than the fourth width W4 of the second bump structures 150, even while the first bump structures 140 have a height greater than that of the second bump structures 150. Therefore, it may be possible to provide the bump structures 140 and 150 having small widths and to prevent bridges between the bump structures 140 and 150 in a reflow process of the bump structures 140 and 150. That is, the present disclosure may provide a semiconductor package may increase in driving stability, when compared to related semiconductor package, as described with reference to FIGS. 4 to 6.

Figure 4:
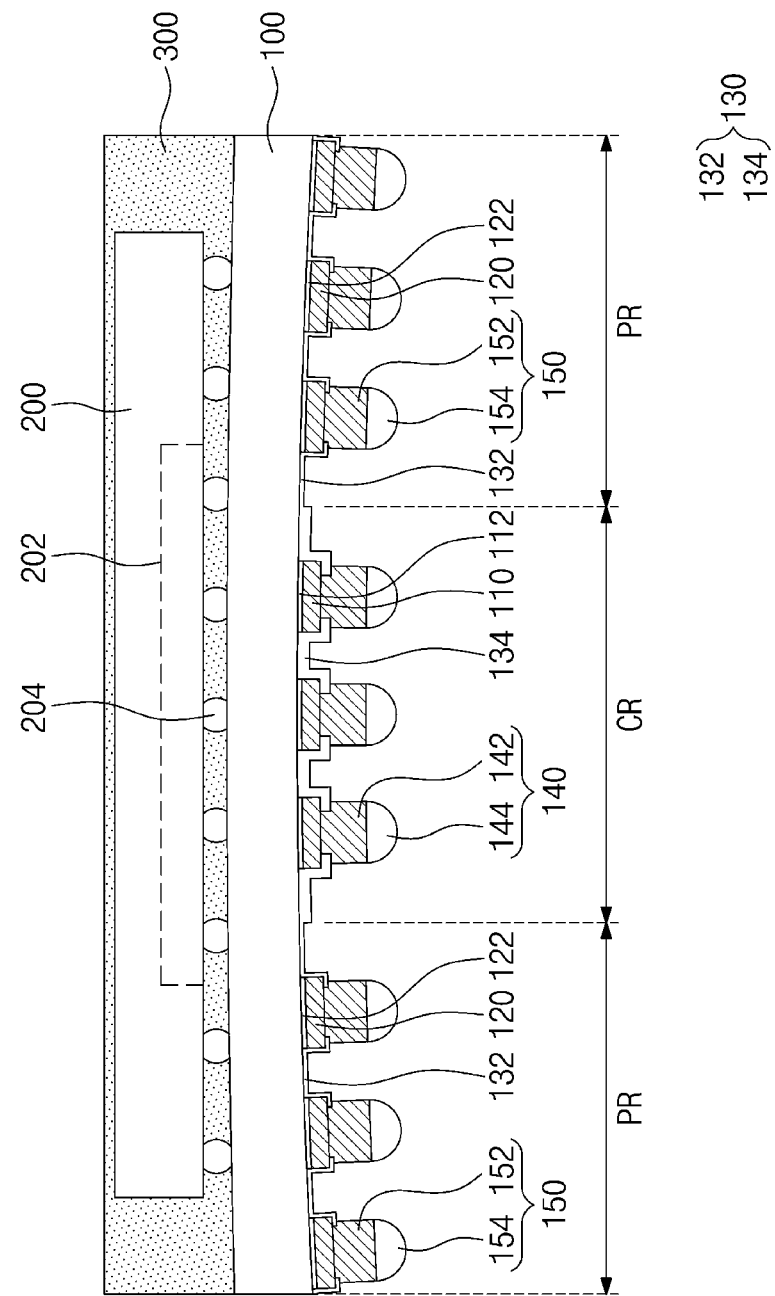
FIGS. 4 to 6 illustrate cross-sectional views showing a semiconductor package, according to some embodiments of the present disclosure.
Figure 5:
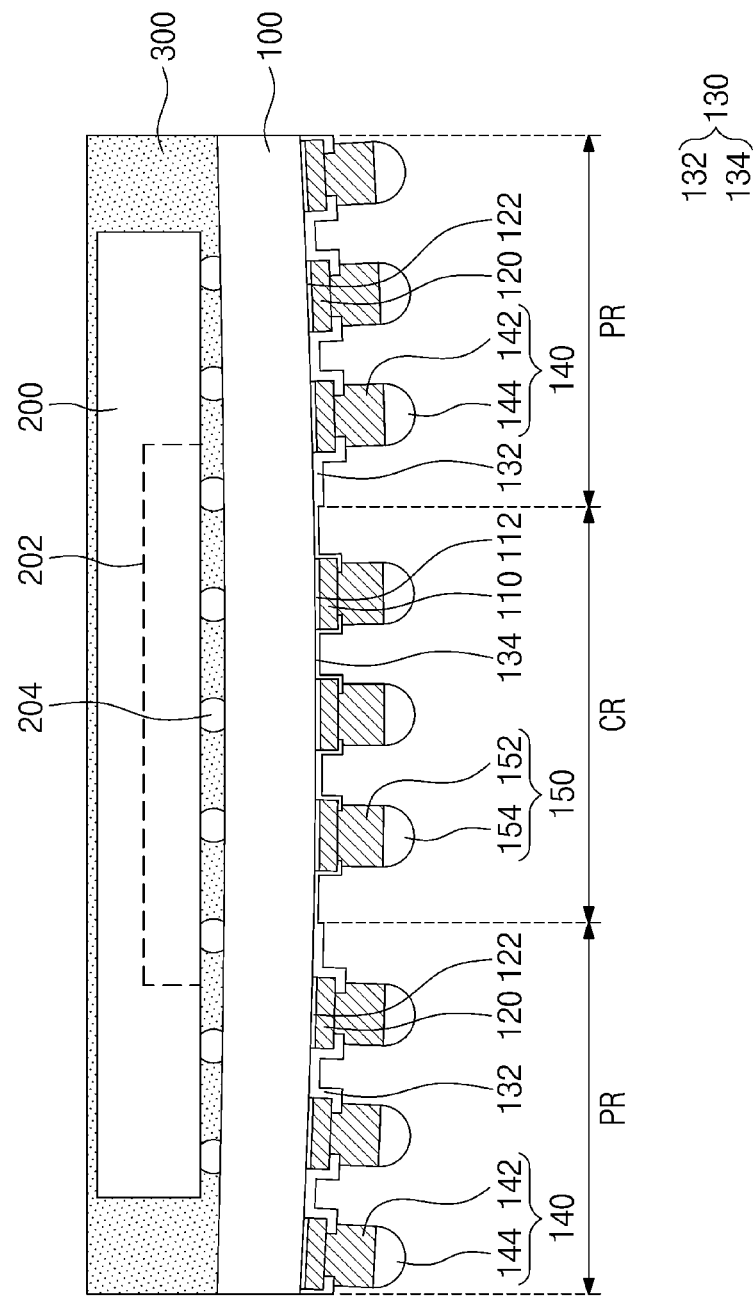
Figure 6:
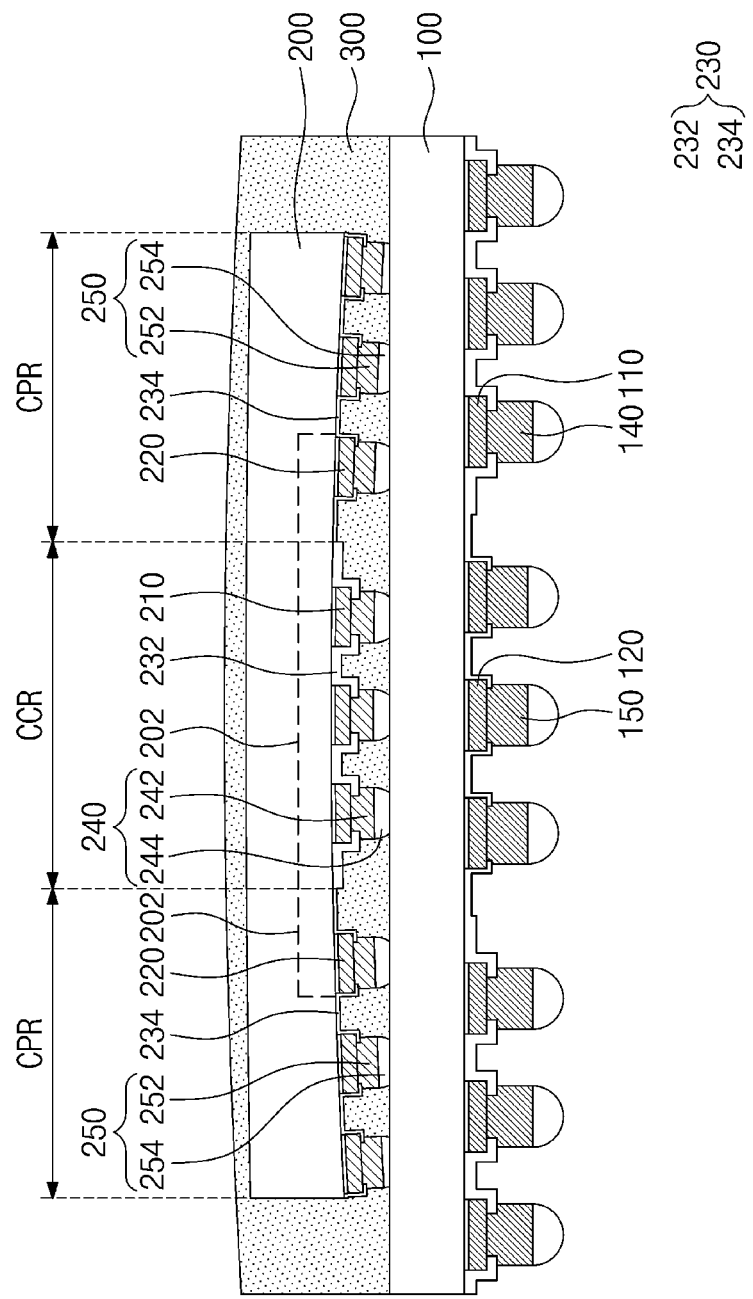

FIGS. 4 to 6 illustrate cross-sectional views showing a semiconductor package, according to some embodiments of the present disclosure.

Referring to FIGS. 4 and 5, a substrate 100 may be provided. The substrate 100 may include or may be similar in many respects to the substrate 100 discussed with reference to FIGS. 1 to 3, and may include additional features not mentioned above. For example, the substrate 100 may include first substrate pads 110, second substrate pads 120, a protection layer 130, first bump structures 140, and second bump structures 150. The first substrate pads 110, the second substrate pads 120, the protection layer 130, the first bump structures 140, and the second bump structures 150 may be provided on one surface of the substrate 100 and/or a bottom surface of the substrate 100.

As shown in FIG. 4, a semiconductor chip 200 may be provided on the substrate 100. The semiconductor chip 200 may include a semiconductor substrate including silicon (Si), for example. The semiconductor chip 200 may include an integrated circuit 202 formed on the semiconductor substrate. For example, the integrated circuit 202 including at least a transistor may be formed on an active surface of the semiconductor chip 200. That is, the integrated circuit 202 may include a logic circuit, a memory circuit, and/or a passive element such as a resistor. Alternatively or additionally, chip pads may be provided on the active surface of the semiconductor chip 200. The chip pads may be electrically connected to the integrated circuit 202 of the semiconductor chip 200. The active surface of the semiconductor chip 200 may be directed toward the substrate 100. For example, the semiconductor chip 200 may be disposed in a face-down state on the substrate 100.

In some embodiments, the semiconductor chip 200 may be mounted on the substrate 100. For example, the semiconductor chip 200 may be flip-chip mounted on the substrate 100. For another example, the semiconductor chip 200 may be electrically connected through connection terminals 204 to the substrate 100. The connection terminals 204 may be provided between substrate upper pads of the substrate 100 and the chip pads of the semiconductor chip 200. The connection terminals 204 may connect the substrate upper pads of the substrate 100 to the chip pads of the semiconductor chip 200.

Alternatively or additionally, the semiconductor chip 200 may be wire-bonded to the substrate 100. For example, the semiconductor chip 200 may be disposed in a face-up state on the substrate 100. The semiconductor chip 200 may be attached to the substrate 100 through an adhesion layer provided on an inactive surface of the semiconductor chip 200. In such an embodiment, bonding wires may be provided to connect the substrate upper pads of the substrate 100 to the chip pads of the semiconductor chip 200.

A molding layer 300 may be provided on the substrate 100. The molding layer 300 may cover a top surface of the substrate 100. Alternatively or additionally, the molding layer 300 may surround the semiconductor chip 200. As shown in FIGS. 4 and 5, the molding layer 300 may cover a top surface of the semiconductor chip 200, but the present disclosure is not limited thereto. For example, in some embodiments, the molding layer 300 may expose the top surface of the semiconductor chip 200. In optional or additional embodiments, the molding layer 300 may include a dielectric material. For example, the molding layer 300 may include, but not be limited to, an epoxy molding compound (EMC).

The substrate 100 may experience warpage caused by heat that may be provided in a process in which the semiconductor chip 200 may be mounted on the substrate 100, another substrate, and/or another device. For example, as shown in FIG. 4, the substrate 100 may be bent into a crying (e.g., convex) shape and/or an inverse U shape. For example, on a bottom surface of the substrate 100, the substrate 100 may have a shape in which a central region CR of the substrate 100 is more recessed (or concave) than an edge region PR of the substrate 100. When viewed in a cross-section view, the central region CR of the substrate 100 may be located at a higher level than that of the edge region PR of the substrate 100. In such embodiments, the central region CR of the substrate 100 may correspond to the first region (e.g., region R1 of FIG. 1) discussed with reference to FIGS. 1 to 3, and the edge region PR of the substrate 100 may correspond to the second region (e.g., second region R2 of FIG. 1) discussed with reference to FIGS. 1 to 3. For example, the protection layer 130 may have a larger thickness on a portion 132 positioned on the central region CR and a smaller thickness on another portion 134 positioned on the edge region PR. An opening formed on the portion 132 of the protection layer 130 positioned on the central region CR may have a width less than that of an opening formed on the another portion 134 of the protection layer 130 positioned on the edge region PR. The first bump structures 140 positioned on the central region CR may have a height greater than that of the second bump structures 150 positioned on the edge region PR. Therefore, a lowermost end of the first bump structures 140 may be located at a level the same as or similar to that of a lowermost end of the second bump structures 150. For example, the height of the first bump structures 140 and the height of the second bump structures 150 may correct warpage of the substrate 100 to allow the first solder bumps 144 and the second solder bumps 154 to lie at the same level.

For another example, as shown in FIG. 5, the substrate 100 may be bent into a smile (e.g., concave) shape and/or a U shape. For example, on the bottom surface of the substrate 100, the substrate 100 may have a shape in which the central region CR of the substrate 100 may be more protruded (or convex) than the edge region PR of the substrate 100. When viewed in a cross-section view, the central region CR of the substrate 100 may be located at a lower level than that of the edge region PR of the substrate 100. In such embodiments, the central region CR of the substrate 100 may correspond to the second region (e.g., region R2 of FIG. 1) discussed with reference to FIGS. 1 to 3, and the edge region PR of the substrate 100 may correspond to the first region (e.g., region R1 of FIG. 1) discussed with reference to FIGS. 1 to 3. For example, the protection layer 130 may have a smaller thickness on a portion 134 positioned on the central region CR and a larger thickness on another portion 132 positioned on the edge region PR An opening formed on the portion 134 of the protection layer 130 positioned on the central region CR may have a width greater than that of an opening formed on the another portion 132 of the protection layer 130 positioned on the edge region PR. The second bump structures 150 positioned on the central region CR may have a height less than that of the first bump structures 140 positioned on the edge region PR. Therefore, a lowermost end of the second bump structures 150 may be located at a level the same as or similar to that of a lowermost end of the first bump structures 140. For example, the height of the second bump structures 150 and the height of the first bump structures 140 may correct warpage of the substrate 100 to allow the second solder bumps 154 and the first solder bumps 144 to lie at the same level.

As discussed with reference to FIGS. 4 and 5, even when there is warpage of the substrate 100, the first bump structures 140 and the second bump structures 150 may have their thicknesses different from each other to allow the first solder bumps 144 and the second solder bumps 154 to lie at the same level, and may be easily coupled to an another substrate or device when the substrate 100 is mounted on the another substrate or device.

FIGS. 4 and 5 depict that the first bump structures 140 and the second bump structures 150 are provided on the substrate 100, but the present disclosure is not limited thereto.

Referring to FIG. 6, a substrate 100 may be provided. The substrate 100 may include or may be similar in many respects the substrate 100 discussed with reference to FIGS. 1 to 3, and may include additional features not mentioned above.

As shown in FIG. 6, a semiconductor chip 200 may be provided on the substrate 100. The semiconductor chip 200 may include a semiconductor substrate including silicon (Si), for example. The semiconductor chip 200 may include an integrated circuit 202 formed on the semiconductor substrate. For example, the integrated circuit 202 including at least a transistor may be formed on an active surface of the semiconductor chip 200. That is, the integrated circuit 202 may include a logic circuit, a memory circuit, and/or a passive element such as a resistor.

The semiconductor chip 200 may include or may be similar in many respects to the substrate 100 discussed with reference to FIGS. 1 to 3, and may include additional features not mentioned above. For example, the semiconductor chip 200 may include first chip pads 210, second chip pads 220, a chip protection layer 230, first chip bump structures 240, and second chip bump structures 250 that are provided on a bottom surface of the semiconductor substrate. The first chip pads 210, the second chip pads 220, the chip protection layer 230, the first chip bump structures 240, and the second chip bump structures 250 may respectively correspond to the first substrate pads 110, the second substrate pads 120, the protection layer 130, the first bump structures 140, and the second bump structures 150 of FIG. 1. The first chip pads 210, the second chip pads 220, the chip protection layer 230, the first chip bump structures 240, and the second chip bump structures 250 may be provided on one surface of the semiconductor chip 200 or a bottom surface of the semiconductor chip 200. The first chip pads 210 and the second chip pads 220 may be electrically connected to the integrated circuit 202 of the semiconductor chip 200. The active surface of the semiconductor chip 200 may be directed toward the substrate 100. For example, the semiconductor chip 200 may be disposed in a face-down state on the substrate 100.

In some embodiments, the semiconductor chip 200 may be mounted on the substrate 100. For example, the semiconductor chip 200 may be flip-chip mounted on the substrate 100. For another example, the semiconductor chip 200 may be electrically connected to the substrate 100 through the first chip bump structures 240 and the second chip bump structures 250. The first chip bump structures 240 and the second chip bump structures 250 may be coupled to substrate upper pads of the substrate 100.

The semiconductor chip 200 may experience warpage caused by heat that may be provided in a process in which the semiconductor chip 200 may be mounted on the substrate 100. For example, as shown in FIG. 6, the semiconductor chip 200 may be bent into a crying (e.g., convex) shape and/or an inverse U shape. For example, on the bottom surface of the semiconductor chip 200, the semiconductor chip 200 may have a shape in which a chip central region CCR of the semiconductor chip 200 is more recessed (or concave) than a chip edge region CPR of the semiconductor chip 200 When viewed in a cross-section view, the chip central region CCR of the semiconductor chip 200 may be located at a higher level than that of the chip edge region CPR of the semiconductor chip 200. In such embodiments, the chip central region CCR of the semiconductor chip 200 may correspond to the first region (e.g., region R1 of FIG. 1) discussed with reference to FIGS. 1 to 3, and the chip edge region CPR may correspond to the second region (e.g., region R2 of FIG. 1) discussed with reference to FIGS. 1 to 3. For example, the chip protection layer 230 may have a larger thickness on a portion 232 positioned on the chip central region CCR and a smaller thickness on another portion 234 positioned on the chip edge region CPR. An opening formed on the portion 232 of the chip protection layer 230 positioned on the chip central region CCR may have a width less than that of an opening formed on the another portion 234 of the chip protection layer 230 positioned on the chip edge region CPR The first chip bump structures 240 positioned on the chip central region CCR may have a height greater than that of the second chip bump structures 250 positioned on the chip edge region CPR. Therefore, a lowermost end of the first chip bump structures 240 may be located at a level that is substantially similar and/or the same as a level of a lowermost end of the second chip bump structures 250. For example, the height of the first chip bump structures 240 and the height of the second chip bump structures 250 may correct warpage of the semiconductor chip 200 to locate solder bumps of the first and second chip bump structures 240 and 250 at the same level.

Alternatively or additionally, the semiconductor chip 200 may be bent into a smile (e.g., concave) shape and/or a U shape. In such embodiments, a height of chip bump structures positioned on the chip edge region CPR may be greater than that of chip bump structures positioned on the chip edge region CPR.

Even when there is warpage of the semiconductor chip 200, the first chip bump structures 240 and the second chip bump structures 250 may have their heights different from each other and may thus be easily coupled to the substrate 100 when the semiconductor chip 200 is mounted on the substrate 100.

A molding layer 300 may be provided on the substrate 100. The molding layer 300 may cover a top surface of the substrate 100. The molding layer 300 may surround the semiconductor chip 200.

In the embodiments that follow, a detailed description of technical features repetitive to those discussed above with reference to FIGS. 1 to 6 may be omitted, and a difference thereof may be discussed. The same reference numerals may be allocated to the same components as those of the semiconductor package discussed above, according to some embodiments of the present disclosure.

Figure 7:
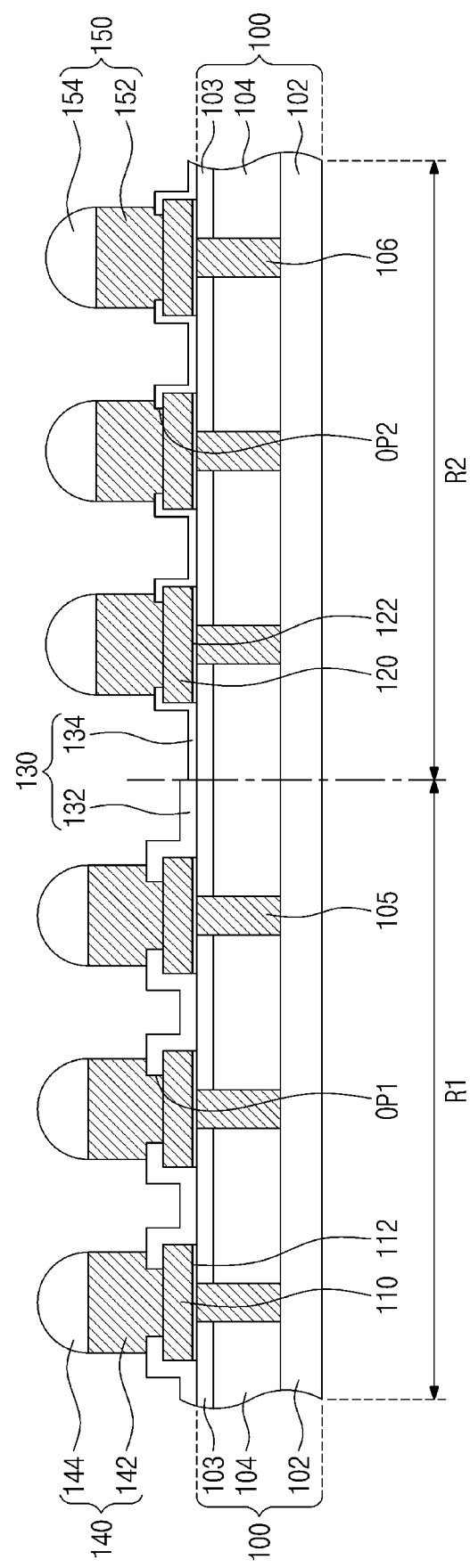
FIG. 7 illustrates a cross-sectional view showing a semiconductor package, according to some embodiments of the present disclosure.

FIG. 7 illustrates a cross-sectional view showing a semiconductor package, according to some embodiments of the present disclosure.

Referring to FIG. 7, a die structure 100 may be provided. The die structure 100 may include a semiconductor substrate 102, a circuit layer 104, a dielectric layer 103, first pads 110, second pads 120, a protection layer 130, first bump structures 140, and second bump structures 150. The die structure 100 may correspond to the substrate 100 discussed above with reference to FIGS. 1 to 6.

The semiconductor substrate 102 may be provided. The semiconductor substrate 102 may be and/or include a semiconductor substrate, such as a semiconductor wafer. Alternatively or additionally, the semiconductor substrate 102 may be and/or include a bulk silicon substrate, a SOI substrate, a germanium (Ge) substrate, a GOI substrate, a silicon-germanium (SiGe) substrate, or an epitaxial film substrate obtained by performing SEG. The semiconductor substrate 102 may include, but not be limited to, silicon (Si), germanium (Ge), silicon germanium (SiGe), gallium arsenic (GaAs), indium gallium arsenic (InGaAs), aluminum gallium arsenic (AlGaAs), and/or a mixture thereof. Alternatively or additionally, the semiconductor substrate 102 may be a dielectric substrate.

In some embodiments, the circuit layer 104 may be provided on the semiconductor substrate 102. The circuit layer 104 may include a circuit pattern provided on the semiconductor substrate 102 and a dielectric layer that covers the circuit pattern. The circuit pattern may be a memory circuit, a logic circuit, or a combination thereof, any of which may include one or more transistors. Alternatively or additionally, the circuit pattern may include a passive element, such as a resistor, an inductor, a capacitor, and the like.

The dielectric layer 103 may be disposed on the circuit layer 104. On the circuit layer 104, the dielectric layer 103 may surround first connection lines 105 and second connection lines 106. The dielectric layer 103 may expose top surfaces of the first connection lines 105 and top surfaces of the second connection lines 106. A top surface of the dielectric layer 103 may be coplanar with the top surfaces of the first connection lines 105 and the top surfaces of the second connection lines 106. The dielectric layer 103 may include oxide, nitride, or oxynitride of a material included in the semiconductor substrate 102 and/or the circuit layer 104. For example, the dielectric layer 103 may include a dielectric material, such as, but not limited to, silicon oxide (SiO), silicon nitride (SiN), silicon oxynitride (SiON), or silicon carbonitride (SiCN).

The first pads 110 and second pads 120 may be disposed on the dielectric layer 103. The first pads 110 may be provided on a first region R1 of the semiconductor substrate 102. The second pads 120 may be provided on a second region R2 of the semiconductor substrate 102. The first pads 110 and the second pads 120 may respectively correspond to the first substrate pads 110 and the second substrate pads 120 discussed with reference to FIGS. 1 to 5, and may include additional features not mentioned above.

The first pads 110 and the second pads 120 may be electrically connected to the circuit pattern of the circuit layer 104. For example, as shown in FIG. 7, the circuit layer 104 may be provided therein with the first connection lines 105 and the second connection lines 106. That is, the first connection lines 105 may be provided on the first region R1, and the second connection lines 106 may be provided on the second region R2. The first connection lines 105 and the second connection lines 106 may each be a through via that vertically penetrates the dielectric layer 103 and a dielectric pattern in the circuit layer 104. The first connection lines 105 may vertically extend in the dielectric layer 103 and the circuit layer 104 to be coupled to the first pads 110. The first connection lines 105 may electrically connect the circuit pattern to the first pads 110. The second connection lines 106 may vertically extend in the dielectric layer 103 and the circuit layer 104 to be coupled to the second pads 120. The second connection lines 106 may electrically connect the circuit pattern to the second pads 120. In some embodiments, various conductive patterns may be provided for interconnection between the circuit pattern, the first connection lines 105, and the second connection lines 106. For example, the first connection lines 105 and the second connection lines 106 may be under-pad patterns and/or redistribution patterns provided in a dielectric pattern provided in the circuit layer 104.

The protection layer 130 may be provided on the dielectric layer 103. The protection layer 130 may cover a top surface of the dielectric layer 103. The protection layer 130 may cover the first pads 110 on the first region R1 and/or may also cover the second pads 120 on the second region R2. On the first region R1, a first dielectric layer 132 may conformally cover the first pads 110 and the top surface of the dielectric layer 103. On the second region R2, a second dielectric layer 134 may conformally cover the second pads 120 and the top surface of the dielectric layer 103. A first thickness of the first dielectric layer 132 may be greater than a second thickness of the second dielectric layer 134.

The protection layer 130 may have first openings OP1 positioned on the first region R1 and second openings OP2 positioned on the second region R2. On the first region R1, the first openings OP1 may be positioned on the first pads 110. On the second region R2, the second openings OP2 may be positioned on the second pads 120. A first width of the first opening OP1 may be less than a second width of the second opening OP2.

On the first region R1, the first bump structures 140 may be disposed on the protection layer 130, and on the second region R2, the second bump structures 150 may be disposed on the protection layer 130. Each of the first bump structures 140 may be positioned on one of the first pads 110. Each of the second bump structures 150 may be positioned on one of the second pads 120. A first distance between the top surface of the dielectric layer 103 and an uppermost end of the first bump structures 140 may be greater than a second distance between the top surface of the dielectric layer 103 and an uppermost end of the second bump structures 150.

Figure 8:
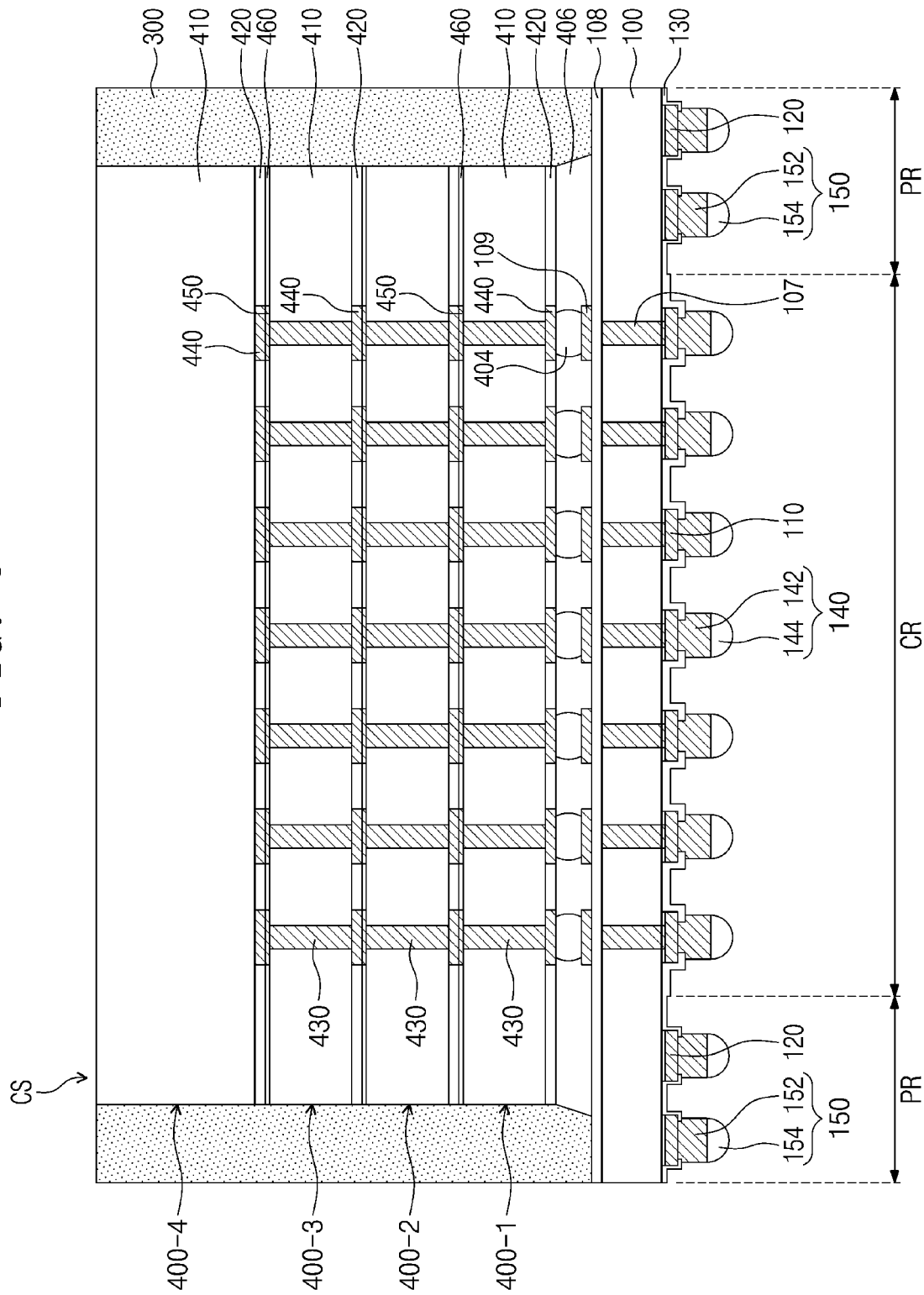
FIG. 8 illustrates a cross-sectional view showing a semiconductor package, according to some embodiments of the present disclosure.

FIG. 8 illustrates a cross-sectional view showing a semiconductor package, according to some embodiments of the present disclosure.

Referring to FIG. 8, a die structure 100 may be provided. The die structure 100 may correspond to the die structure 100 discussed with reference to FIG. 7. For example, the die structure 100 may include a first semiconductor substrate, a first circuit layer, connection lines 107, a dielectric layer, first pads 110, second pads 120, a protection layer 130, first bump structures 140, and second bump structures 150. For convenience of description, FIG. 7 omits an illustration of configurations of the first semiconductor substrate, the first circuit layer, and the dielectric layer depicted in the die structure 100. The first pads 110, the second pads 120, the protection layer 130, the first bump structures 140, and the second bump structures 150 may be provided on one surface of the die structure 100 or a bottom surface of the die structure 100. The die structure 100 may further include an upper die protection layer 108 that covers a top surface of the die structure 100, and/or may also further include third die pads 109 on the upper die protection layer 108. The connection lines 107 may vertically penetrate the die structure 100 to connect the third die pads 109 to the first pads 110. Alternatively or additionally, the connection lines 107 may be connected to at least portions of the first and second pads 110 and 120.

A chip stack CS may be disposed on the die structure 100. The chip stack CS may include one or more semiconductor dies (e.g., 400-1, 400-2, 400-3, and 400-4, hereinafter "400" generally) that may be stacked on the die structure 100. Each of the semiconductor dies 400 may be a memory chip, such as, but not limited to, dynamic random access memory (DRAM), static random access memory (SRAM), magnetoresistive random access memory (MRAM), and a flash memory. Alternatively or additionally, each of the semiconductor dies 400 may be and/or include a logic chip. As shown in FIG. 8, a single chip stack CS may be disposed, but the present disclosure is not limited thereto. When multiple chip stacks CS are provided, the chip stacks CS may be spaced apart from each other on the die structure 100. The following description focuses on a lowermost semiconductor die 400-1 but the description may apply to the remaining semiconductor dies (e.g., 400-2, 400-3, and 400-4).

The semiconductor die 400-1 may include a second semiconductor substrate 410, a second circuit layer 420, lower pads 440, through vias 430, upper pad 450, and an upper passivation layer 460.

The second semiconductor substrate 410 may include a semiconductor material. For example, the second semiconductor substrate 410 may be and/or include a monocrystalline silicon (Si) substrate. Alternatively or additionally, a bottom surface of the second semiconductor substrate 410 may be an active surface, and a top surface of the second semiconductor substrate 410 may be an inactive surface.

The second circuit layer 420 may be provided on the bottom surface of the second semiconductor substrate 410. The second circuit layer 420 may include an integrated circuit. For example, the second circuit layer 420 may be a memory circuit. For example, the semiconductor die 400-1 may be a memory chip. For another example, the second circuit layer 420 may be and/or include a logic circuit. For example, the second circuit layer 420 may include an electronic element such as a transistor, a dielectric pattern, and a wiring pattern.

The lower pad 440 may be disposed on the bottom surface of the second semiconductor substrate 410. The lower pad 440 may be disposed in a lower portion of the second circuit layer 420. A bottom surface of the lower pad 440 may be substantially flat and coplanar with that of the second circuit layer 420. The lower pad 440 may be coupled to the integrated circuit in the second circuit layer 420. In some embodiments, more than one lower pad 440 may be provided. The lower pad 440 may be a front pad of the semiconductor die 400-1.

The upper pads 450 may be disposed on the top surface of the second semiconductor substrate 410, and on the top surface of the second semiconductor substrate 410. Alternatively or additionally, the upper passivation layer 460 may surround the upper pads 450. The upper passivation layer 460 and the upper pads 450 may have their top surfaces that are substantially flat and coplanar with each other.

The through vias 430 may vertically penetrate the second semiconductor substrate 410 to connect the lower pads 440 to the upper pads 450.

An uppermost semiconductor die 400-4 and the lowermost semiconductor die 400-1 may have therebetween intermediate semiconductor dies 400-2 and 400-3 each of which may be substantially similar to the lowermost semiconductor die 400-1.

The uppermost semiconductor die 400-4 may be substantially similar to the lowermost semiconductor die 400-1. However, unlike other semiconductor dies 400-1, 400-2, and 400-3, the uppermost semiconductor die 400-4 may not include the through vias 430, the upper pads 450, and the upper passivation layer 460.

The semiconductor dies 400-1, 400-2, 400-3, and 400-4 may be bonded to each other. The following description focuses on a bonding between the lowermost semiconductor die 400-1 (referred to hereinafter as a first die) and its overlying semiconductor die 400-2 (referred to hereinafter as a second die) among bonding between the semiconductor dies 400-1, 400-2, 400-3, and 400-4.

The second die 400-2 may be bonded to the first die 400-1. On an interface between the first die 400-1 and the second die 400-2, the upper passivation layer 460 of the first die 400-1 may be bonded to a dielectric pattern of the second circuit layer 420 of the second die 400-2. In such embodiments, the upper passivation layer 460 and the dielectric pattern of the second circuit layer 420 may constitute a hybrid bonding of oxide, nitride, or oxynitride. As used herein, the term "hybrid bonding" may denote a bonding in which two components of the same kind are merged at an interface therebetween. For example, a continuous configuration may be formed between the upper passivation layer 460 and its bonded dielectric pattern of the second circuit layer 420, and an invisible interface may be provided between the upper passivation layer 460 and the dielectric pattern of the second circuit layer 420. For another example, the upper passivation layer 460 and the dielectric pattern of the second circuit layer 420 may be formed of the same material, and thus no interface may be present between the upper passivation layer 460 and the dielectric pattern of the second circuit layer 420. The upper passivation layer 460 and the dielectric pattern of the second circuit layer 420 may be provided as one component. For example, the upper passivation layer 460 and the dielectric pattern of the second circuit layer 420 may be bonded to form a single unitary piece. The present disclosure, however, is not limited thereto. That is, the upper passivation layer 460 and the dielectric pattern of the second circuit layer 420 may be formed of different materials from each other. Alternatively or additionally, the upper passivation layer 460 and the dielectric pattern of the second circuit layer 420 may have no continuous configuration, and a visible interface may be present between the upper passivation layer 460 and the dielectric pattern of the second circuit layer 420.

On the interface between the first die 400-1 and the second die 400-2, the upper pads 450 of the first die 400-1 may be bonded to the lower pads 440 of the second die 400-2. In such embodiments, the upper pads 450 and the lower pads 440 may constitute an intermetallic hybrid bonding. For example, the upper pad 450 and the lower pad 440 bonded to each other may have a continuous configuration, and an invisible interface may be present between the upper pad 450 and the lower pad 440. For example, the upper pad 450 and the lower pad 440 may be formed of the same material, and thus no interface may be present between the upper pad 450 and the lower pad 440. Thus, the upper pad 450 and the lower pad 440 may be provided in the form of one component. For example, the upper pad 450 and the lower pad 440 may be bonded to form a single unitary piece.

The chip stack CS may be mounted on the die structure 100. The chip stack CS may be disposed on the die structure 100. The third die pads 109 of the die structure 100 may be vertically aligned with the lower pads 440 of the first die 400-1. Die connection terminals 404 may be provided between the third die pads 109 and the lower pads 440. The die connection terminals 404 may connect the third die pads 109 to the lower pads 440.

An underfill layer 406 may be provided between the die structure 100 and the chip stack CS. The underfill layer 406 may fill a space between the die structure 100 and the first die 400-1 of the chip stack CS. The underfill layer 406 may surround the die connection terminals 404.

A molding layer 300 may cover the chip stack CS on the die structure 100. The molding layer 300 may protect the chip stack CS. The molding layer 300 may include a dielectric material. For example, the molding layer 300 may include an EMC.

FIGS. 9 to 19 illustrate cross-sectional views showing a method of fabricating a semiconductor package, according to some embodiments of the present disclosure.

Figure 9:
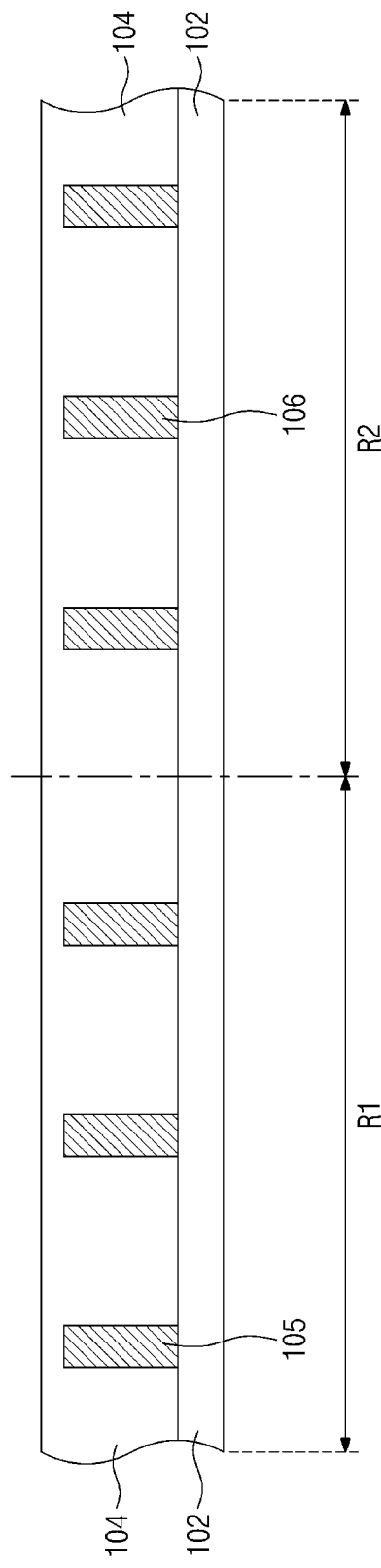

Referring to FIG. 9, a semiconductor substrate 102 may be provided. The semiconductor substrate 102 may have a first region R1 and a second region R2. A circuit layer 104 may be formed on the semiconductor substrate 102. For example, the semiconductor substrate 102 may undergo a typical method to form an integrated circuit. Afterwards, on the semiconductor substrate 102, wiring patterns may be formed to connect with the integrated circuit, and dielectric patterns may be formed to bury the wiring patterns. The circuit layer 104 may have first connection lines 105 and second connection lines 106 for connecting the semiconductor substrate 102 to first pads (e.g., first pads 110 of FIG. 14) and second pads (e.g., second pads 120 of FIG. 14), as described with reference to FIGS. 10 to 12. The first connection lines 105 may be formed on the first region R1, and the second connection lines 106 may be formed on the second region R2. The dielectric pattern of the circuit layer 104 may cover the first connection lines 105 and the second connection lines 106.

Figure 10:
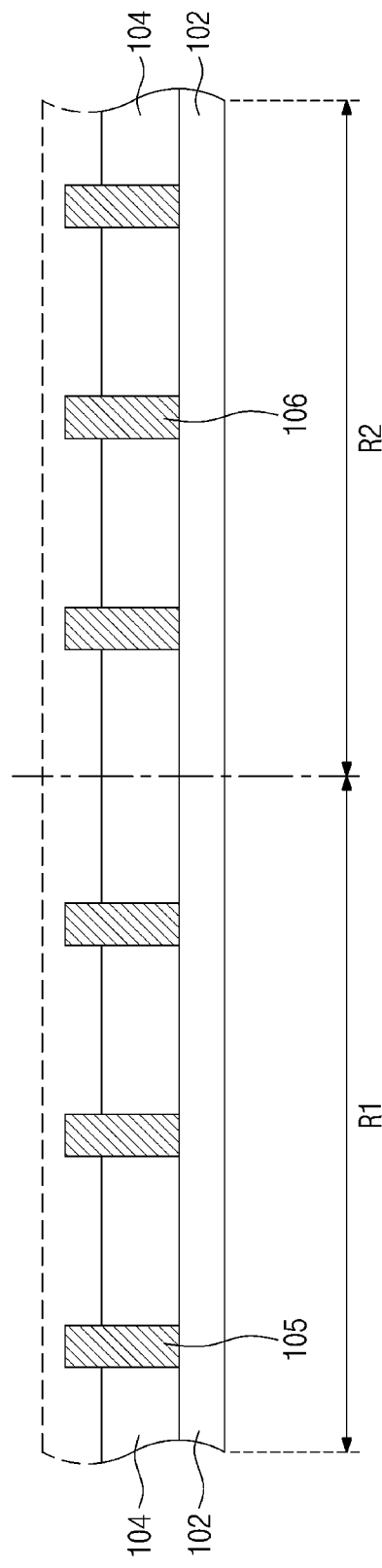

Referring to FIG. 10, an etch-back process may be performed on the circuit layer 104. Consequently, a top surface of the circuit layer 104 may approach the semiconductor substrate 102. In some embodiments, the top surface of the circuit layer 104 may be located at a lower level than that of top surfaces of the first connection lines 105 and that of top surfaces of the second connection lines 106. For example, the first connection lines 105 and the second connection lines 106 may protrude from the top surface of the circuit layer 104.

Referring to FIG. 11, a dielectric layer 103 may be formed on the circuit layer 104. For example, the dielectric layer 103 may be formed by depositing and/or coating a dielectric material that covers the first connection lines 105, the second connection lines 106, and the top surface of the circuit layer 104. The dielectric layer 103 may conformally cover the top surface of the circuit layer 104, lateral and top surfaces of the first connection lines 105 that protrude from the circuit layer 104, and lateral and top surfaces of the second connection lines 106 that protrude from the circuit layer 104.

Referring to FIG. 12, a planarization process may be performed on the dielectric layer 103. The planarization process may remove a portion of the dielectric layer 103 that covers the lateral and top surfaces of the first connection lines 105 that protrude from the circuit layer 104 and the lateral and top surfaces of the second connection lines 106 that protrude from the circuit layer 104. Alternatively or additionally, the planarization process may remove portions of the first connection lines 105 that protrude from the circuit layer 104 and/or portions of the second connection lines 106 that protrude from the circuit layer 104. The planarization process may cause the first and second connection lines 105 and 106 to protrude onto a top surface of the dielectric layer 103. After the planarization process, the top surface of dielectric layer 103 may be substantially flat and coplanar with the top surfaces of the first connection lines 105 and the top surfaces of the second connection lines 106.

When a substrate (e.g., substrate 100 of FIG. 1) including a package substrate and/or an interposer substrate is provided instead of the method discussed with reference of FIGS. 9 to 12, a semiconductor package may be fabricated which is discussed with reference to FIG. 1. The following description focuses on the embodiment shown in FIG. 12.

Figure 13:
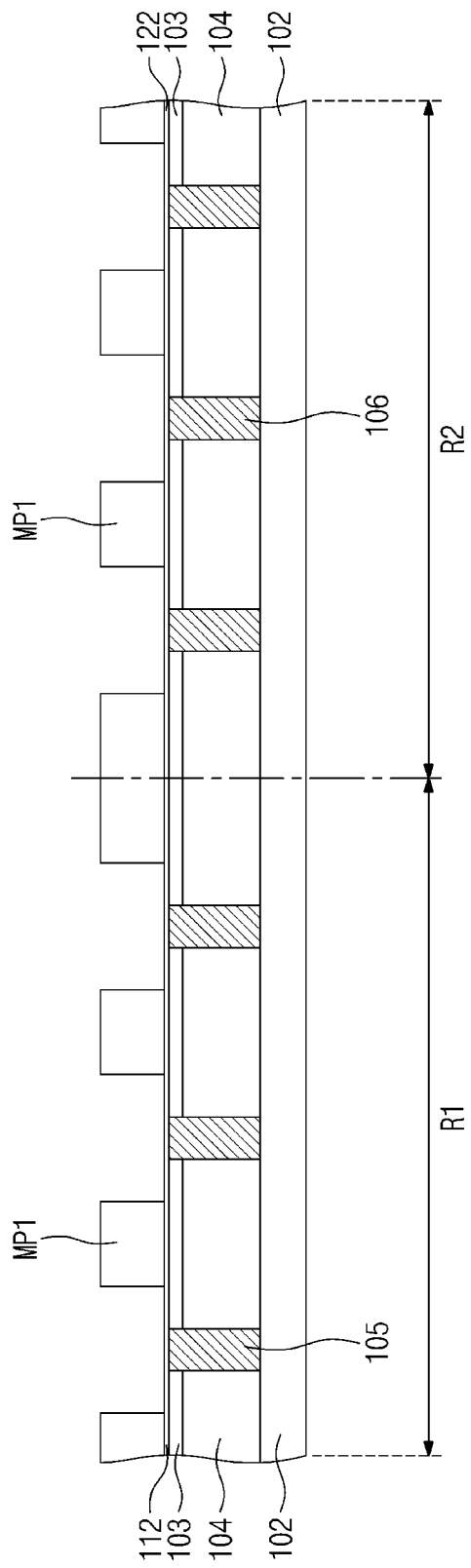

Referring to FIG. 13, a first seed layer 112 and a second seed layer 122 may be formed on the dielectric layer 103. The seed layers 112 and 122 may cover the dielectric layer 103 on the first region R1 and the second region R2, respectively. In some embodiments, the first seed layer 112 on the first region R1 and the second seed layer 122 on the second region R2 may be formed as one continuous layer.

A first mask pattern MP1 may be formed on the seed layers 112 and 122. The first mask pattern MP1 may have patterns that expose a top surface of the seed layers 112 and 122. For example, the first mask pattern MP1 may have first patterns positioned on the first connection lines 105 on the first region R1, and the first patterns may define areas where first pads (e.g., first pads 110 of FIG. 4) may be formed in a subsequent process. Alternatively or additionally, the first mask pattern MP1 may have second patterns positioned on the second connection lines 106 on the second region R2, and the second patterns may define areas where second pads (e.g., second pads 120 of FIG. 14) may be formed in a subsequent process.

Figure 14:
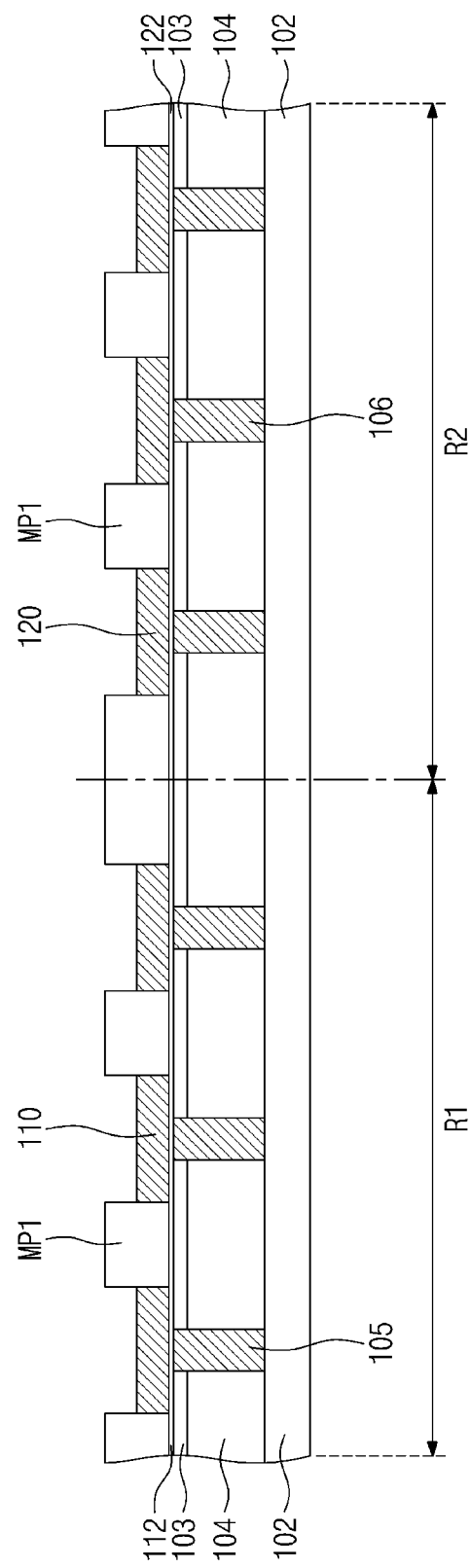

Referring to FIG. 14, first pads 110 and second pads 120 may be formed on the seed layers 112 and 122. For example, the seed layers 112 and 122 exposed by the first mask pattern MP1 may be used as a seed to perform a plating process. The plating process may fill a metallic material into the first pattern and the second pattern of the first mask pattern MP1. Consequently, the first pads 110 may be formed in the first pattern on the first region R1, and the second pads 120 may be formed in the second pattern on the second region R2. In some embodiments, the first pads 110 may have the same width and height as those of the second pads 120.

Figure 15:
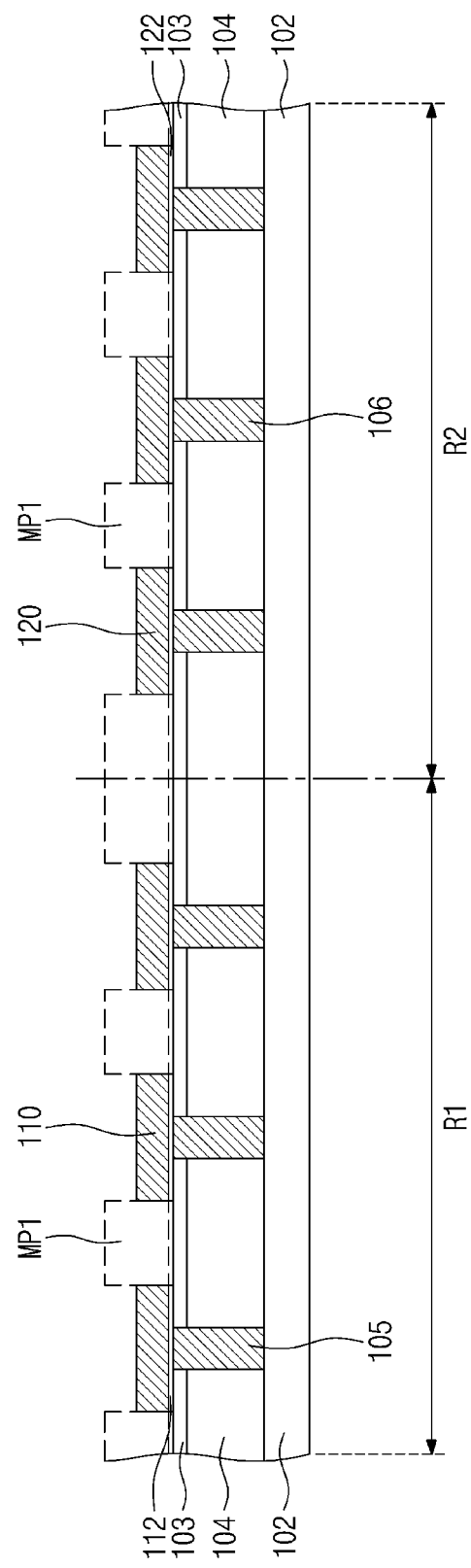

Referring to FIG. 15, the first mask pattern MP1 may be removed. Consequently, the seed layers 112 and 122 may be exposed at its portions positioned between the first pads 110, between the second pads 120, and between the first pads 110 and the second pads 120. The portions of the seed layers 112 and 122 may be portions of the seed layers 112 and 122 that are positioned below the first mask pattern MP1.

The first pads 110 and the second pads 120 may be used as a mask to pattern the seed layer 112 and 122. Therefore, the portions of the seed layers 112 and 122 may be removed which are positioned between the first pads 110, between the second pads 120, and between the first pads 110 and the second pads 120. The seed layers 112 and 122 may remain below the first pads 110 and the second pads 120. Thus, a first seed layer 112 may be formed below the first pads 110, and a second seed layer 122 may be formed below the second pads 120.

Figure 16:
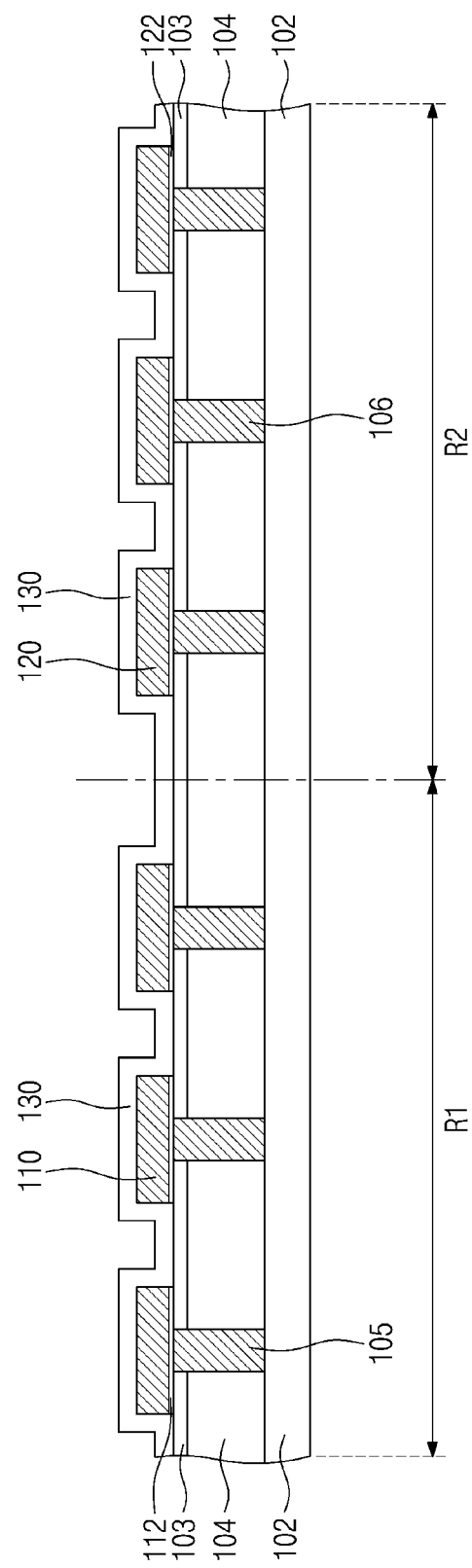

Referring to FIG. 16, a protection layer 130 may be formed on the dielectric layer 103. For example, the protection layer 130 may be formed by depositing and/or coating a dielectric material that covers the top surface of the dielectric layer 103, the first pads 110, and the second pads 120. The protection layer 130 may conformally cover the top surface of the dielectric layer 103, lateral and top surfaces of the first substrate pads 110, and lateral and top surfaces of the second substrate pads 120. In some embodiments, a thickness of the protection layer 130 on the first region R1 may be substantially similar and/or the same as that of the protection layer 130 on the second region R2. The protection layer 130 may include a photo-imageable material. For example, the protection layer 130 may include a PID. That is, the photo-imageable dielectric may include, but not be limited to, at least one of PI, PBO, phenolic polymers, and benzocyclobutene polymers.

Figure 17:
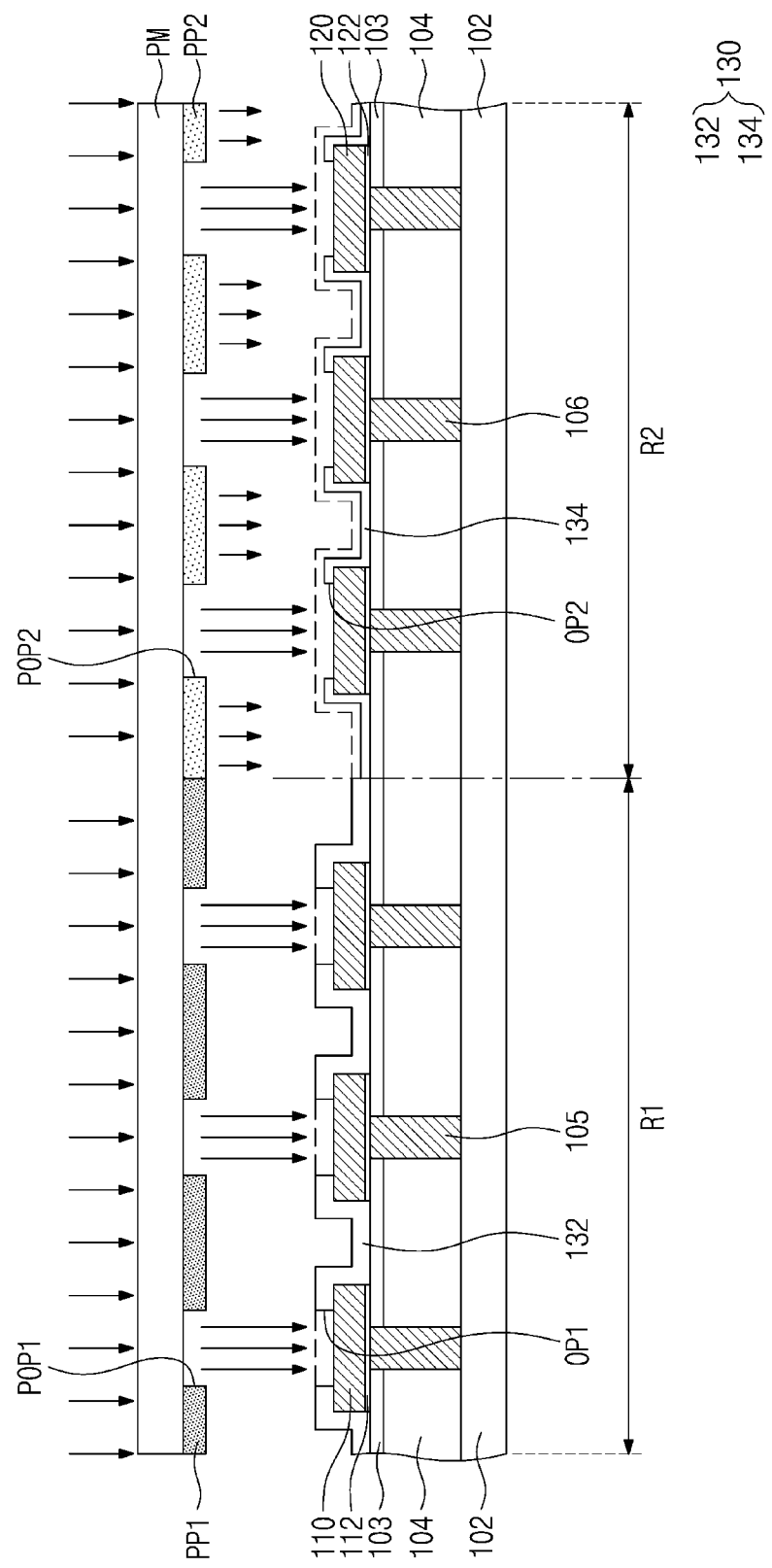

Referring to FIG. 17, an exposure process may be performed on the protection layer 130. For example, a photomask PM may be provided on the protection layer 130. The photomask PM may have a first photo pattern PP1 that corresponds to the first region R1 and a second photo pattern PP2 that corresponds to the second region R2. The first photo pattern PP1 may have first pattern openings POP1. The first pattern openings POP1 may correspond to first openings OP1 formed on the protection layer 130 on the first region R1. For example, light irradiated to the photomask PM may pass through the first pattern openings POP1 to reach the protection layer 130 on the first region R1, and a portion of the protection layer 130 to which the light is irradiated may be removed in a subsequent process to form the first openings OP1. The second photo pattern PP2 may have second pattern openings POP2. The second pattern openings POP2 may correspond to second openings OP2 formed on the protection layer 130 on the second region R2. For example, light irradiated to the photomask PM may pass through the second pattern openings POP2 to reach the protection layer 130 on the second region R2, and a portion of the protection layer 130 to which the light is irradiated may be removed in a subsequent process to form the second openings OP2.

In some embodiments, a first dielectric layer 132 may be defined to indicate the protection layer 130 positioned on the first region R1 on which the first openings OP1 are formed, and a second dielectric layer 134 may be defined to indicate the protection layer 130 positioned on the second region R2 on which the second openings OP2 are formed.

In the photomask PM, an exposure amount toward the first region R1 may be different from that toward the second region R2. For example, the photomask PM may include a phase shift mask (PSM). The first photo pattern PP1 may not allow incident light to pass therethrough, and the second photo pattern PP2 may allow a portion of incident light to pass therethrough. As used herein, the phrase "the first photo pattern PP1 and the second photo pattern PP2 allow light to pass therethrough" may refer to the photomask PM allowing light to pass through a region on which neither the first pattern openings POP1 nor the second pattern openings POP2 are formed. Therefore, on the first region R1, no exposure may be performed on a remaining portion of the first dielectric layer 132 except its portions where the first openings OP1 are formed. On the second region R2, light exposure may be performed on a remaining portion of the second dielectric layer 134 except its portions where the second openings OP2 are formed. Thus, the first openings OP1 may be formed in the first dielectric layer 132 on the first pads 110, but a thickness of the first dielectric layer 132 may not be reduced. The second openings OP2 may be formed in the second dielectric layer 134 on the second pads 120, and at the same time, a thickness of the second dielectric layer 134 may be reduced. Accordingly, the thickness of the second dielectric layer 134 may be less than that of the first dielectric layer 132. In some embodiments, the second dielectric layer 134 may be exposed by light that has passed through the second photo pattern PP2 in the vicinity of the second openings OP2. As a result, each of the second openings OP2 may have a width greater than that of each of the first openings OP1.

According to some embodiments of the present disclosure, the PSM-type photomask PM may be used to form the protection layer 130 having different thicknesses on the first region R1 and the second region R2, and thus no additional process may be required to adjust the thickness of the protection layer 130. Thus, the present disclosure may provide a simplified method of fabricating a semiconductor package, when compared to a method of fabricating a related semiconductor package.

Figure 18:
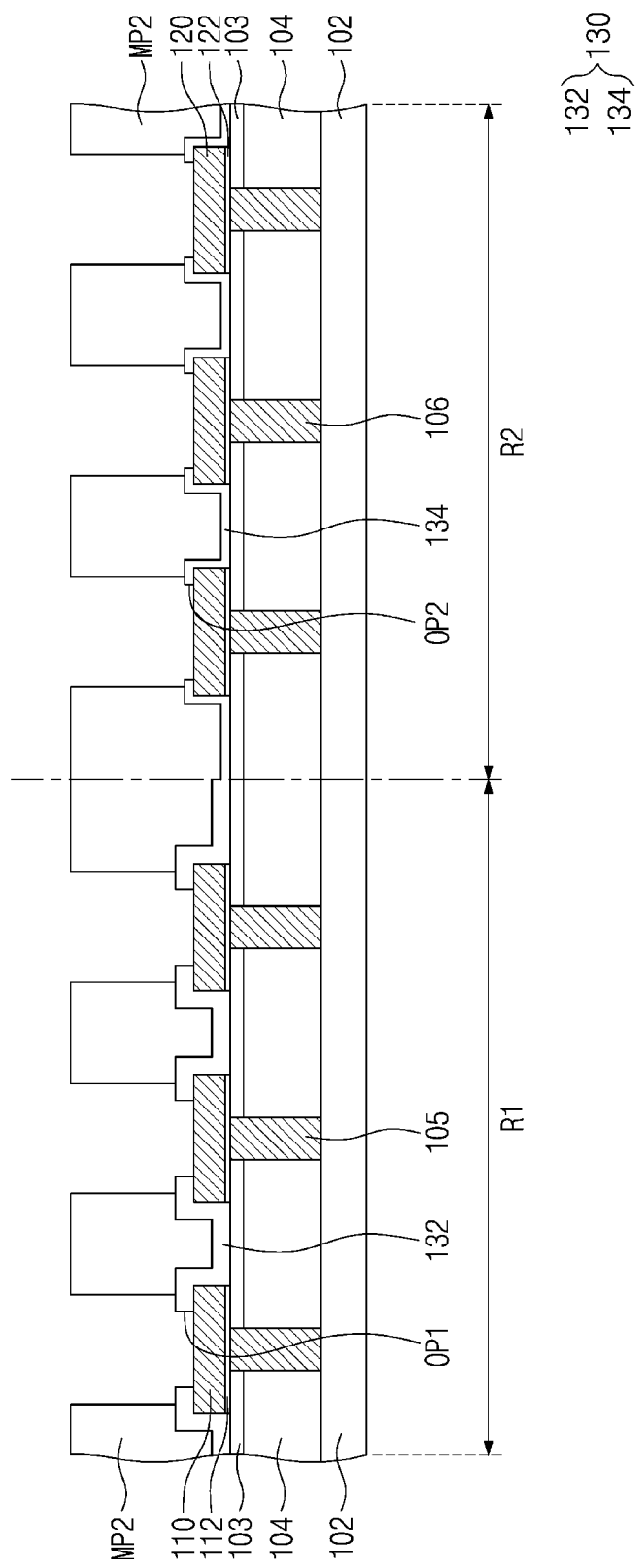

Referring to FIG. 18, a second mask pattern MP2 may be formed on the protection layer 130. The second mask pattern MP2 may have patterns that expose the top surfaces of the first pads 110 and the top surfaces of the second pads 120. For example, the second mask pattern MP2 may have third patterns positioned on the first pads 110 on the first region R1, and the third patterns may define areas where first conductive posts (e.g., first conductive posts 142 of FIG. 19) may be formed in a subsequent process. In some embodiments, the third patterns may have their widths greater than those of the first openings OP1. When viewed in a plan view, the first openings OP1 may be positioned within the third patterns. For example, on the first pads 110, the first dielectric layer 132 may extend into the third patterns of the second mask pattern MP2.

The second mask pattern MP2 may have fourth patterns positioned on the second pads 120 on the second region R2, and the fourth patterns may define areas where second conductive posts (e.g., second conductive posts 152 of FIG. 19) may be formed in a subsequent process. The fourth patterns may have their widths greater than those of the second openings OP2 of the second dielectric layer 134. When viewed in a plan view, the second openings OP2 may be positioned within the fourth patterns. For example, on the second pads 120, the second dielectric layer 134 may extend into the fourth patterns of the second mask pattern MP2.

The widths and planar shapes of the third patterns may be substantially similar and/or the same as those of the fourth patterns. The first openings OP1 may have their widths less than those of the second openings OP2, and the first dielectric layer 132 may have its thickness greater than that of the second dielectric layer 134. Consequently, a portion of the first dielectric layer 132 that extends into the third patterns may have a volume greater than that of a portion of the second dielectric layer 134 that extends into the fourth patterns. For example, a volume in the third patterns may be less than that in the fourth patterns.

Figure 19:
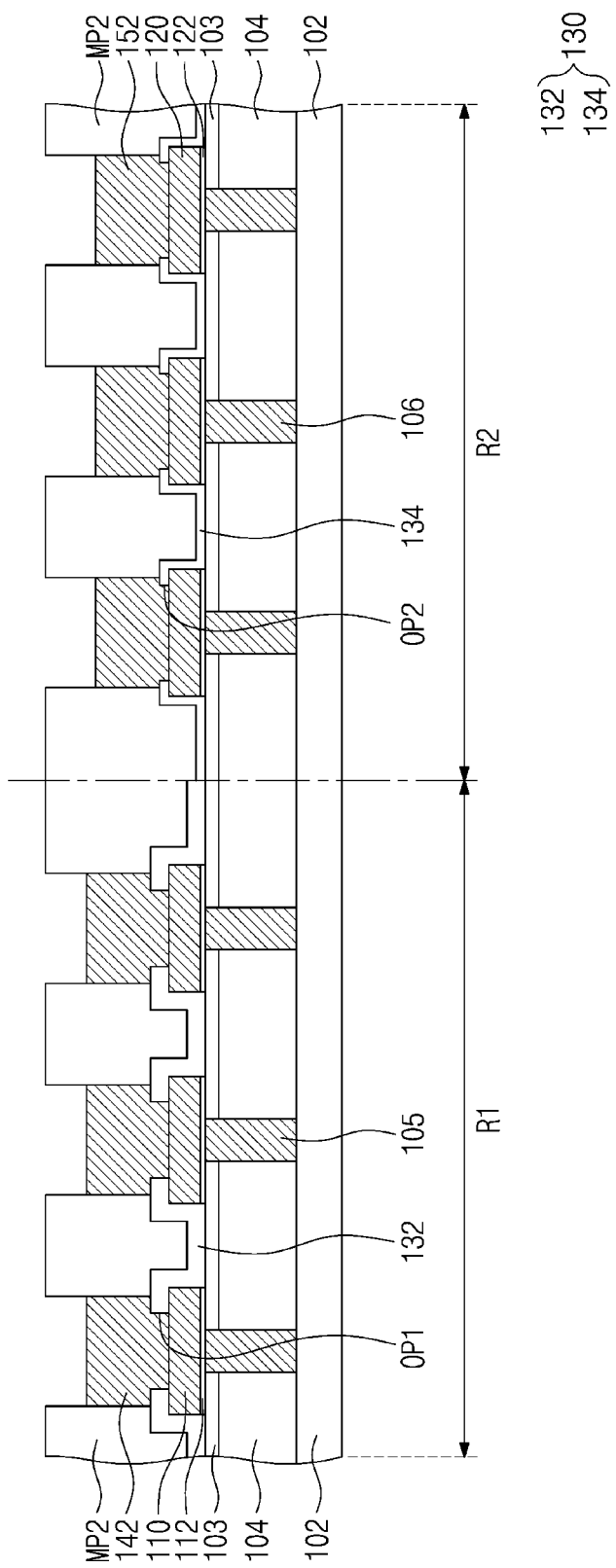

Referring to FIG. 19, first conductive posts 142 may be formed on the first pads 110, and second conductive posts 152 may be formed on the second pads 120. For example, the first pads 110 and the second pads 120 exposed by the second mask pattern MP2 may be used as a seed to perform a plating process. The plating process may fill a metallic material into the third pattern and the fourth pattern of the second mask pattern MP2. Thus, on the first region R1, the first conductive posts 142 may be formed in the third pattern, and on the second region R2, the second conductive posts 152 may be formed in the fourth pattern. The first conductive posts 142 may have the same width as that of the second conductive posts 152. As the volume in the third patterns is less than that in the fourth patterns, the first conductive posts 142 may be formed to have their heights greater than those of the second conductive posts 152.

Referring back to FIG. 7, first solder bumps 144 may be formed on the first conductive posts 142, and second solder bumps 154 may be formed on the second conductive posts 152.

Subsequently, the second mask pattern MP2 may be removed.

In a semiconductor package, according to some embodiments of the present disclosure, bump structures may be configured to have their heights different from each other in accordance with position on a substrate. Therefore, even when there is warpage of the substrate or deviations in height of pads on another substrate or device on which the substrate is mounted, there may be no occurrence of contact failure where the bump structures may not be coupled to the pads. As a result, the semiconductor package may increase in driving stability.

In addition, the bump structures may have the same width while having different heights. Therefore, it may be possible to provide the bump structures having small widths and to prevent bridges between the bump structures in a reflow process of the bump structures. As a result, the present disclosure may provide a semiconductor package that may increase in driving stability, when compared to related semiconductor packages.

In a method of fabricating a semiconductor package, according to some embodiments of the present disclosure, a PSM-type photomask may be used to form a protection layer having different thicknesses on a first region and a second region, and thus no additional process may be required to adjust a thickness of the protection layer. As a result, the present disclosure may provide a simplified method of fabricating a semiconductor package, when compared to a fabricating method of related semiconductor packages.

Although the present disclosure has been described in connection with some embodiments illustrated in the accompanying drawings, it is to be understood by one of ordinary skill in the art that variations in form and detail may be made therein without departing from the spirit and essential feature of the present disclosure. The above disclosed embodiments should thus be considered illustrative and not restrictive.

What is claimed is:
1. A semiconductor package, comprising:
   a substrate comprising a first region and a second region spaced apart from the first region;
   a first pad on the substrate of the first region;
   a second pad on the substrate of the second region;
   a first dielectric layer disposed on the substrate on the first region, the first dielectric layer comprising a first opening that exposes the first pad;
   a second dielectric layer disposed on the substrate on the second region, the second dielectric layer comprising a second opening that exposes the second pad;

a first bump structure disposed on the first pad and in the first opening of the first dielectric layer; and a second bump structure disposed on the second pad and in the second opening of the second dielectric layer, wherein a first thickness of the first dielectric layer is greater than a second thickness of the second dielectric layer, and wherein a first distance between the substrate and an uppermost end of the first bump structure is longer than a second distance between the substrate and an uppermost end of the second bump structure.

2. The semiconductor package of claim 1, wherein:
the first bump structure fills the first opening, and
the second bump structure fills the second opening.

3. The semiconductor package of claim 2, wherein a first width of the first opening is less than a second width of the second opening.

4. The semiconductor package of claim 3, wherein the second width of the second opening is about 1.1 times to about 1.5 times the first width of the first opening.

5. The semiconductor package of claim 2, wherein:
at least a first portion of the first bump structure extends onto the first dielectric layer, and
at least a second portion of the second bump structure extends onto the second dielectric layer.

6. The semiconductor package of claim 1, wherein a difference between the first thickness of the first dielectric layer and the second thickness of the second dielectric layer is about 20% to about 80% of the first thickness of the first dielectric layer.

7. The semiconductor package of claim 1, wherein a difference between the first distance and the second distance is about 2% to about 10% of the first distance.

8. The semiconductor package of claim 1, wherein:
the first bump structure comprises:
    a first conductive post penetrating the first dielectric layer and coupled to the first pad; and
    a first solder bump on the first conductive post, and
the second bump structure comprises:
    a second conductive post penetrating the second dielectric layer and coupled to the second pad; and
    a second solder bump on the second conductive post.

9. The semiconductor package of claim 1, wherein the substrate has a shape in which a first recess level of the first region is deeper than a second recess level of the second region.

10. The semiconductor package of claim 1, further comprising:
a semiconductor chip on a second surface of the substrate, the second surface being opposite to a first surface on which the first pad and the second pad are disposed; and
a molding layer disposed on the second surface of the substrate, the molding layer burying the semiconductor chip.

11. The semiconductor package of claim 1, wherein
the substrate comprises a semiconductor substrate,
the semiconductor substrate comprises:
    an integrated circuit on a surface of the semiconductor substrate; and
    a plurality of through electrodes that penetrate the semiconductor substrate, and
the first pad and the second pad are electrically coupled to at least one of the integrated circuit and the plurality of through electrodes.

12. A semiconductor package, comprising:
a substrate comprising a central region and a peripheral region that surrounds the central region;

a first pad on the central region on a bottom surface of the substrate;

a second pad on the peripheral region on the bottom surface of the substrate;

a dielectric layer on the bottom surface of the substrate and disposed on the first pad and the second pad, the dielectric layer comprising a first opening that exposes at least a portion of a bottom surface of the first pad and a second opening that exposes at least a portion of a bottom surface of the second pad;

a first bump structure on the dielectric layer on the central region and coupled through the first opening to the first pad;

a second bump structure on the dielectric layer on the peripheral region and coupled through the second opening to the second pad;

a semiconductor chip on a top surface of the substrate; and a molding layer covering the top surface of the substrate and burying the semiconductor chip, wherein the substrate has a concave shape, wherein a first recess level of the central region is deeper than a second recess level of the peripheral region, wherein a first thickness of the dielectric layer on the first pad is greater than a second thickness of the dielectric layer on the second pad, and wherein a first width of the first opening is less than a second width of the second opening.

13. The semiconductor package of claim 12, wherein a first height of the first bump structure is greater than a second height of the second bump structure.

14. The semiconductor package of claim 13, wherein a difference between the first height and the second height is about 2% to about 10% of the first height.

15. The semiconductor package of claim 12, wherein:
the first bump structure fills the first opening, and
the second bump structure fills the second opening.

16. The semiconductor package of claim 15, wherein:
at least a first portion of the first bump structure extends onto the dielectric layer, and
at least a second portion of the second bump structure extends onto the dielectric layer.

17. The semiconductor package of claim 12, wherein the second width of the second opening is about 1.1 times to about 1.5 times the first width of the first opening.

18. The semiconductor package of claim 12, wherein a difference between the first thickness and the second thickness is about 20% to about 80% of the first thickness.

19. The semiconductor package of claim 12, wherein:
the first bump structure comprises:
    a first conductive post penetrating the dielectric layer and coupled to the first pad; and
    a first solder bump on the first conductive post, and
the second bump structure comprises:
    a second conductive post penetrating the dielectric layer and coupled to the second pad; and
    a second solder bump on the second conductive post.

20. A semiconductor package, comprising:
a substrate comprising a first region and a second region spaced apart from the first region;
a first pad on the substrate of the first region;
a second pad on the substrate of the second region;
a dielectric layer on the substrate and covering at least a first portion of the first pad and at least a second portion of the second pad, the dielectric layer comprising a first opening that exposes at least a third portion of a top surface of the first pad and a second opening that exposes at least a fourth portion of a top surface of the second pad;
a first bump structure on the dielectric layer and coupled through the first opening to the first pad; and
a second bump structure on the dielectric layer and coupled through the second opening to the second pad,
wherein a difference between a first thickness of the dielectric layer on the first region and second thickness of the dielectric layer on the second region is about 20% to about 80% of the first thickness.

* * * * *